US00RE46445E

(19) United States
(12) Reissued Patent
Zhang et al.

(10) Patent Number: US RE46,445 E
(45) Date of Reissued Patent: Jun. 20, 2017

(54) NBT BASED LEAD-FREE PIEZOELECTRIC MATERIALS FOR HIGH POWER APPLICATIONS

(71) Applicant: The Penn State Research Foundation, University Park, PA (US)

(72) Inventors: Shujun Zhang, State College, PA (US); Hyeong Jae Lee, State College, PA (US); Thomas R Shrout, Furnace, PA (US)

(73) Assignee: The Penn State Research Foundation, University Park, PA (US)

(21) Appl. No.: 14/819,216

(22) Filed: Aug. 5, 2015

Related U.S. Patent Documents

Reissue of:
(64) Patent No.: 8,501,031
Issued: Aug. 6, 2013
Appl. No.: 12/586,543
Filed: Sep. 24, 2009

(51) Int. Cl.

| | |
|---|---|
| ***H01L 41/187*** | (2006.01) |
| ***C04B 35/475*** | (2006.01) |
| ***C04B 35/468*** | (2006.01) |
| ***C04B 35/626*** | (2006.01) |
| ***H01L 41/43*** | (2013.01) |
| *H01L 41/107* | (2006.01) |

(52) U.S. Cl.
CPC ..... *C04B 35/4682* (2013.01); *C04B 35/475* (2013.01); *C04B 35/6262* (2013.01); *C04B 35/62675* (2013.01); *H01L 41/1873* (2013.01); *H01L 41/43* (2013.01); *C04B 2235/3201* (2013.01); *C04B 2235/3203* (2013.01); *C04B 2235/3215* (2013.01); *C04B 2235/3217* (2013.01); *C04B 2235/3224* (2013.01); *C04B 2235/3234* (2013.01); *C04B 2235/3236* (2013.01); *C04B 2235/3262* (2013.01); *C04B 2235/3267* (2013.01); *C04B 2235/3272* (2013.01); *C04B 2235/3275* (2013.01); *C04B 2235/3277* (2013.01); *C04B 2235/3279* (2013.01); *C04B 2235/3298* (2013.01); *C04B 2235/445* (2013.01); *C04B 2235/5436* (2013.01); *C04B 2235/604* (2013.01); *C04B 2235/72* (2013.01); *C04B 2235/77* (2013.01); *H01L 41/107* (2013.01)

(58) Field of Classification Search
CPC . C04B 35/4682; C04B 35/475; C04B 35/468; C04B 2235/3201; C04B 2235/3203; H01L 41/43; H01L 41/187
See application file for complete search history.

(56) References Cited

U.S. PATENT DOCUMENTS

| | | | |
|---|---|---|---|
| 6,231,779 B1 | 5/2001 | Chiang et al. | |
| 6,443,900 B2 | 9/2002 | Adachi | |
| 7,090,785 B2 | 8/2006 | Chiang et al. | |
| 7,525,239 B2 | 4/2009 | Aoki | |
| 7,646,140 B2 | 1/2010 | Aoki | |
| 2002/0014196 A1* | 2/2002 | Takase et al. | 117/1 |
| 2002/0036282 A1 | 3/2002 | Chiang et al. | |
| 2003/0001131 A1 | 1/2003 | Takase | |
| 2005/0109263 A9 | 5/2005 | Chiang et al. | |
| 2007/0001553 A1 | 1/2007 | Kawada et al. | |
| 2007/0167803 A1 | 7/2007 | Kaminsky | |
| 2008/0061263 A1 | 3/2008 | Kawada et al. | |
| 2008/0237530 A1 | 10/2008 | Tsukada et al. | |
| 2008/0237531 A1 | 10/2008 | Tsukada et al. | |

FOREIGN PATENT DOCUMENTS

| | | |
|---|---|---|
| CN | 1381425 | * 11/2002 |
| CN | 1381425 A | 11/2002 |
| EP | 1253122 | * 10/2002 |
| JP | 2001151566 | 6/2001 |
| JP | 2002248100 | 9/2002 |
| JP | 2002 321976 | 11/2002 |
| JP | 2002 348173 | 12/2002 |
| JP | 200898627 | 4/2008 |
| JP | 200912997 | 1/2009 |
| WO | WO2006117952 | 9/2006 |

OTHER PUBLICATIONS

S. J. Zhang et al., "Piezoelectric properties in perovskite 0.948(Ko.5Nao.5)NbO3-0.052LiSbO3 lead free ceramics," J. Appl. Phys., vol. 100, art No. 104108, 2008.
S. J. Zhang at al., "Mitigation of thermal and fatigue behavior in (Ko.5Nao.5)NbO3-based lead free piezoceramics." Appl. Phys. Lett., vol. 92, art. No. 152904, 2008.
Chinese Office Action dated Mar. 5, 2012.
English translation of Chinese Office Action dated Mar. 5, 2012.
Lin et al., Structural and electrical properties of . . . lead-free piezoelectric ceramics, Solid State Ionics 178 (2008) 1930-1937.
Li et al., "Effects of Mn02 addition on microstructure and electrical properties of . . . ", Journal of Electroceramics, vol. 20, No. 2, Nov. 21, 2007, pp. 89-94.
Baek et al., "Investigation of lead-free piezoceramics . . . with scanning probe microscope", Journal of Physics Conference Series 61 (2007) 545-549.
Zuo et al., "Tantalum doped . . . piezoelectric ceramics", Jounal of the European Ceramic Society 28 (2008) 871-877.
Translation of Japanese Office action dated Aug. 20, 2013 in JP-01235-P.
Translation for JP 2002-348173—Apr. 2002.*
Translation for JP 2002-321976—Aug. 2002.*
(Continued)

*Primary Examiner* — Jerry D Johnson
(74) *Attorney, Agent, or Firm* — Law Offices of John A. Parrish

(57) ABSTRACT

Piezoelectric compounds of the formula $xNa_mBi_nTiO_3$-$yK_mBi_nTiO_3$-$zLi_mBi_nTiO_3$-$pBaTiO_3$ where ($0<x\leq1$), ($0\leq y\leq1$), ($0\leq z\leq1$), ($0.3\leq m\leq0.7$), ($0.3\leq n\leq0.7$), ($0<p\leq1$) ($0.9\leq m/n\leq1.1$) as well as to doped variations thereof are disclosed. The material is suitable for high power applications.

27 Claims, 12 Drawing Sheets

(56) References Cited

OTHER PUBLICATIONS

T. R. Shrout et al., "Lead free piezoelectric ceramics: Alternatives for PZT?" J. Electroceramics, vol. 19, pp. 111-124, 2007.
Y. Saito et al., "Lead-free piezoceramics," Nature, vol. 432, pp. 84-86,2004.
Hiruma, et al., "Phase transition temperatures and piezoelectric properties of (Bi1/2Na1/2)TiO3-(Bi1/2K1/2)TiO3-BaTiO3 lead-free piezoelectric ceramics," Jpn. J. Appl. Phys., vol. 45, pp. 7409-7412, 2008.
K. Carl and K. H. Hardtl, "Electrical after-effects in Pb(Ti,Zr)O3 ceramics," Ferroelectrics, vol. 17, pp. 473-486,1978.
T. R. Shrout et al., "High performance, high temperature perovskite piezoelectric ceramics", Piezoelectric Materials in Devices, (EPFL Swiss Federal Institule of Technology, Switzerland, 2002), p. 413.
Xiao et al, Studies on New Systems fo Lead-free Piezoelectric Ceramics, Vo. 23, No. 11, Nov. 2004.
Lin et al, Synthesis and piezoelectric properties of [Bi1-z (Na1-x-y-zKxLiy]0.5 BazTiO3 lead-free piezoelectric ceramics, J. Electroceram (2008) 21: 271-274, published May 4, 2007.
English translation of Chinese Office Action dated Mar. 5, 2012, Mar. 5, 2013.

* cited by examiner (a)Piezoelectric coefficient ($d_{33}$), mechanical quality factor $Q_m$, and (b)dielectric constant(K), dielectric loss(tan$\delta$) and (c)electromechanical coupling factors ($k_{ij}$) as a function of the amount Mn.

NBT BASED LEAD-FREE PIEZOELECTRIC MATERIALS FOR HIGH POWER APPLICATIONS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

This application claims priority to U.S. provisional patent application 61/194,461 filed Sep. 26, 2008.

FIELD OF THE INVENTION

The disclosed invention relates to hard lead free piezoelectric materials.

BACKGROUND OF THE INVENTION

Hard PZT ferroelectric materials such as PZT4 and PZT8 have been the mainstay in last half century for high power applications. However, the lead content in PZT type ceramics is an environmental concern in electronic devices. For example, the European Union is proposing directives on waste from electrical and electronic equipment as well restrictions on hazardous substances and end-of life vehicles. The USA and Japan are expected to issue similar environmental regulations. It therefore is desirable to develop lead-free piezoelectric ceramics to replace lead-based materials.

Lead-free ceramic compounds may be categorized into three primary types, all of which have the $ABO_3$ perovskite formulation: (1) $BaTiO_3$ ("BT"), (2) $K_{0.5}Na_{0.5}NbO_3$ ("KNN") and (3) $Na_{0.5}Bi_{0.5}TiO_3$ ("NBT"). These compounds, however, either display low $T_C$ (≤120° C.), show low piezoelectric activity, multiple polymorphic phase transitions as well as depolarization temperature which limit their utility. Various properties of these compounds are shown in Table I. In Table I, KCN is $K_4CuNb_8O_{23}$ and MPB is Morphotropic Phase Boundary.

Lead-free ceramic compounds such as solid solutions of NBT with $K_{0.5}Bi_{0.5}TiO_3$ ("KBT"), NBT-KBT-BT, NBT-KBT- with $Li_{0.5}Bi_{0.5}TiO_3$ ("LBT") show a morphotropic phase boundary analogous to PZT and relaxor-PT systems. NBT-KBT, NBT-KBT-BT, and NBT-KBT-LBT, however, exhibit a nonpolar antiferroelectric phase transition temperature that occurs below their $T_C$ that limits their temperature range of use. Lead-free ceramic compounds such as KNN—$LiNbO_3$ ("KNN-LN"), KNN—$LiTaO_3$ ("KNN-LT"), KNN—$LiSbO_3$ ("KNN-LS"), and KNN—$Sr(Ba)TiO_3$ have piezoelectric properties comparable to hard PZT ceramic compounds. However, these KNN type lead-free compounds exhibit low mechanical quality factor Q and a shift in the orthorhombic-tetragonal polymorphic phase transition temperature from about 200° C. to about room temperature. This polymorphic phase transition significantly limits their utility due to property variations.

A need therefore exists for high performance lead free piezoelectric ceramic materials that avoid the toxic lead of prior art $Pb(Zr_xTi_{1-x})O_3$ ("PZT") piezoelectric ceramics and the disadvantages of prior art, lead free piezoelectric ceramics.

BRIEF DESCRIPTION OF THE DRAWINGS

FIG. 2(b) shows dielectric permittivity (K) and dielectric loss (tan δ) as a function of Mn dopant level in BNBK 79 piezoelectric compounds;

FIG. 2 (c) shows electromechanical coupling factors ($k_{ij}$) as a function of Mn dopant level in BNBK79 piezoelectric compounds;

TABLE I

Dielectric and Piezoelectric Properties of Lead-free Piezoelectrics

| Material | $\epsilon_r/\epsilon_0$ | loss | $d_{33}$ (pC/N) | $k_o$ | $k_{33}$ | $T_c$ (° C.) | $T_{O-T}/T_d$ (° C.) | Q |
|---|---|---|---|---|---|---|---|---|
| $BaTiO_3$ | 1700 | 0.01 | 190 | 0.36 | 0.5 | 115 | 0 | 100 |
| $BaTiO_3$—$CaTiO_3$—Co | 1420 | 0.005 | 150 | 0.31 | 0.46 | 105 | −45 | 800 |
| $(K_{0.5}Na_{0.5})NbO_3$ (HP) | 500 | 0.02 | 127 | 0.46 | 0.6 | 420 | 200 | 240 |
| $(K_{0.5}Na_{0.5})NbO_3$ | 290 | 0.04 | 80 | 0.35 | 0.51 | 420 | 195 | 100 |
| KNN-Li (7%) | 950 | 0.084 | 240 | 0.45 | 0.64 | 460 | ~20 | / |
| KNN-Li3%; Ta20% (LF3) | 920-1256 | 0.024-0.02 | 190-230 | 0.46-0.505 | 0.62 | 310-323 | 50-70 | / |
| KNN-LF4* | 1570 | / | 410 | 0.61 | / | 253 | 25 | / |
| KNN-$SrTiO_3$ (5%) | 950 | / | 200 | 0.37 | / | 277 | 27 | 70 |
| KNN-$LiTaO_3$ (5%) | 570 | 0.04 | 200 | 0.36 | / | 430 | 55 | 50 |
| KNN-$LiNbO_3$ (6%) | 500 | 0.04 | 235 | 0.42 | 0.61 | 460 | 70 | 50 |
| KNN-$LiSbO_3$ (5%) | 1288 | 0.019 | 283 | 0.50 | / | 392 | 45 | 40 |
| KNN-KCN | 290 | 0.006 | 90 | 0.36 | 0.55 | 410 | 190 | 1500 |
| NBT-KBT-LBT | 1550 | 0.034 | 216 | 0.401 | / | 350 | 160 | / |
| NBT-KBT-BT | 820 | 0.03 | 145 | 0.162 | 0.519 | 302 | 224 | 110 |
| NBT-KBT-BT (MPB) | 730 | 0.02 | 173 | 0.33 | 0.59 | 290 | 162 | 150 |
| PZT5A | 1700 | 0.02 | 370 | 0.60 | 0.71 | 365 | / | 75 |
| PZT5H | 3400 | 0.02 | 600 | 0.65 | 0.75 | 193 | / | 75 |

Figure 5A:
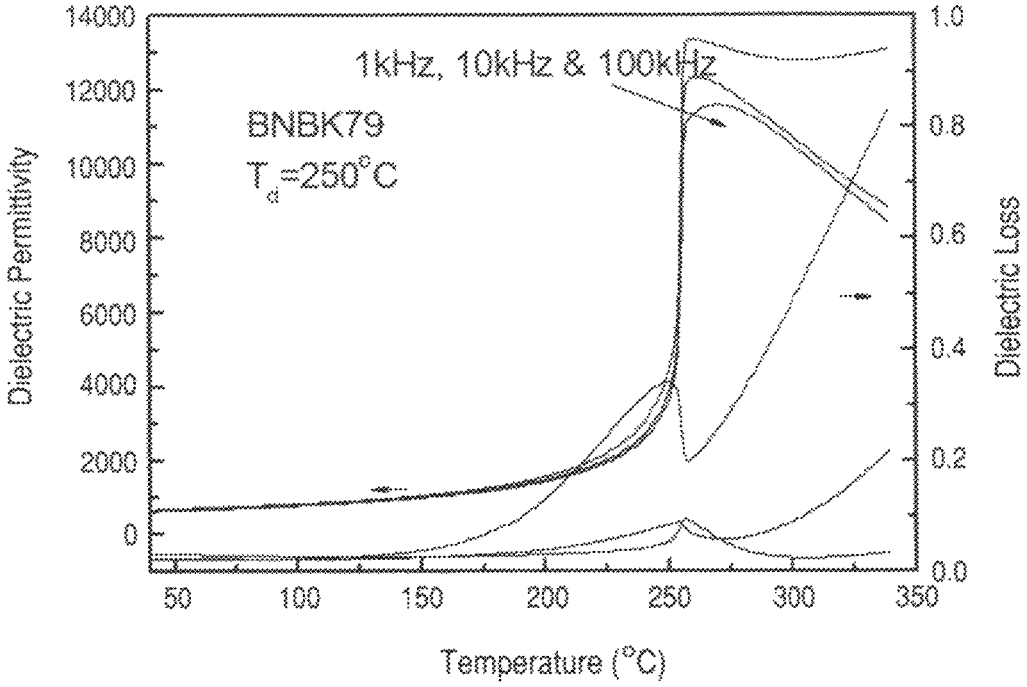
Figure 5B:
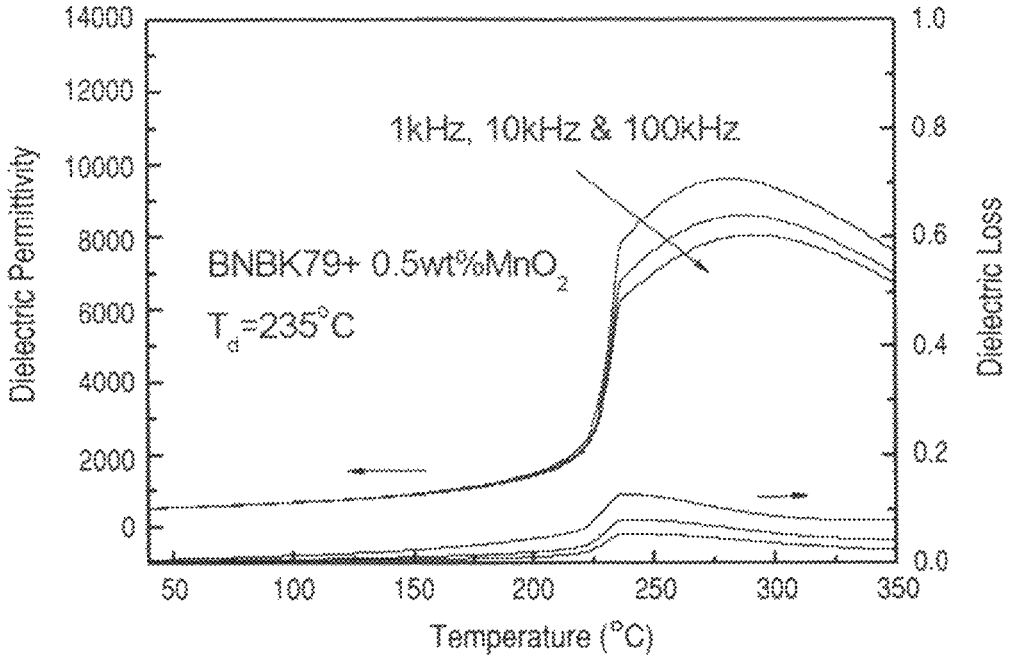
Figure 5C:
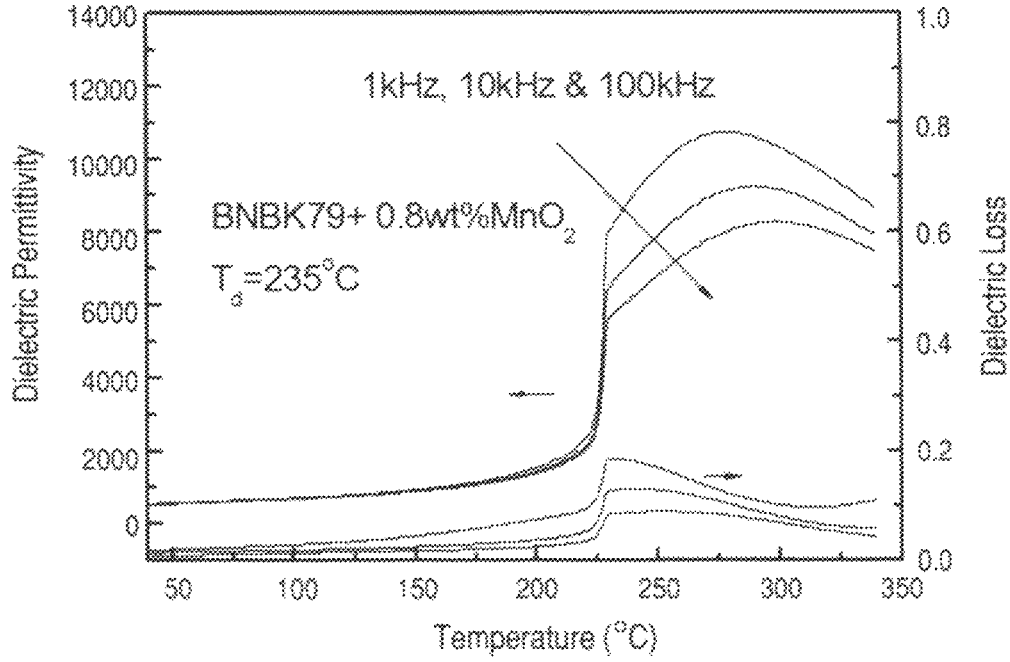
Figure 5D:
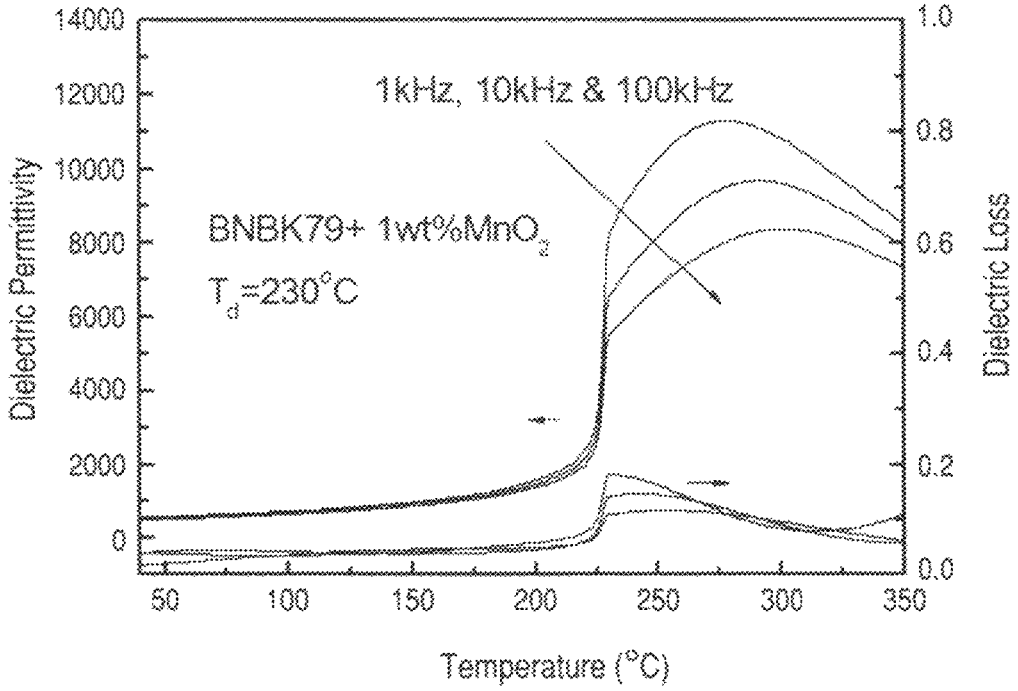
Figure 6:
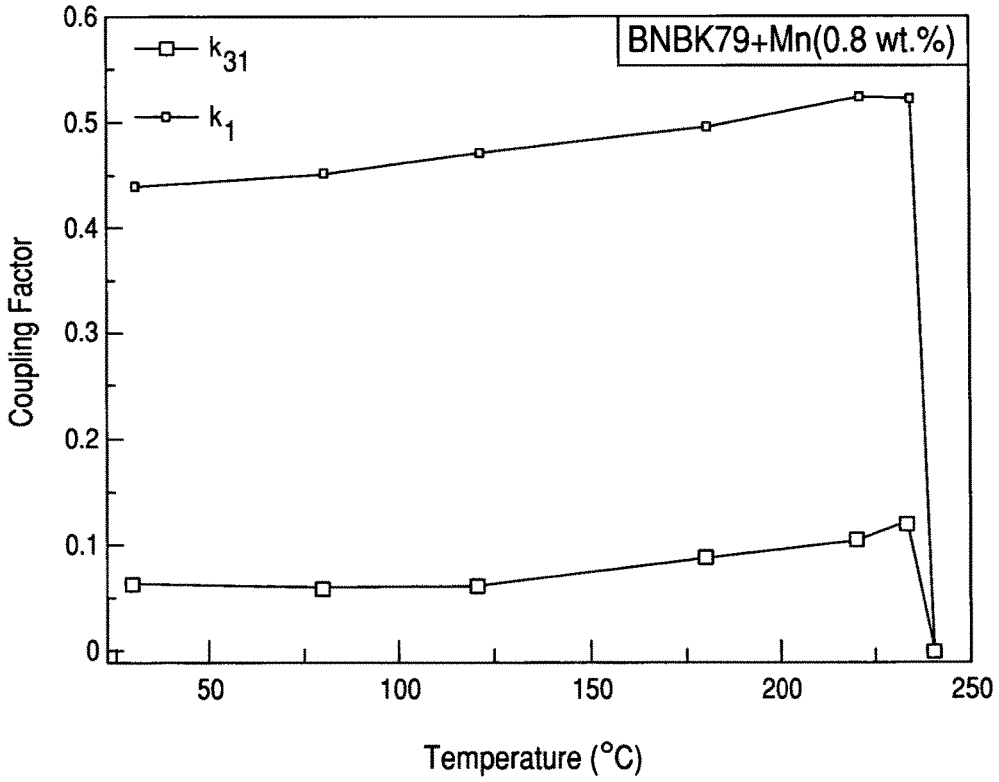
Figure 7:
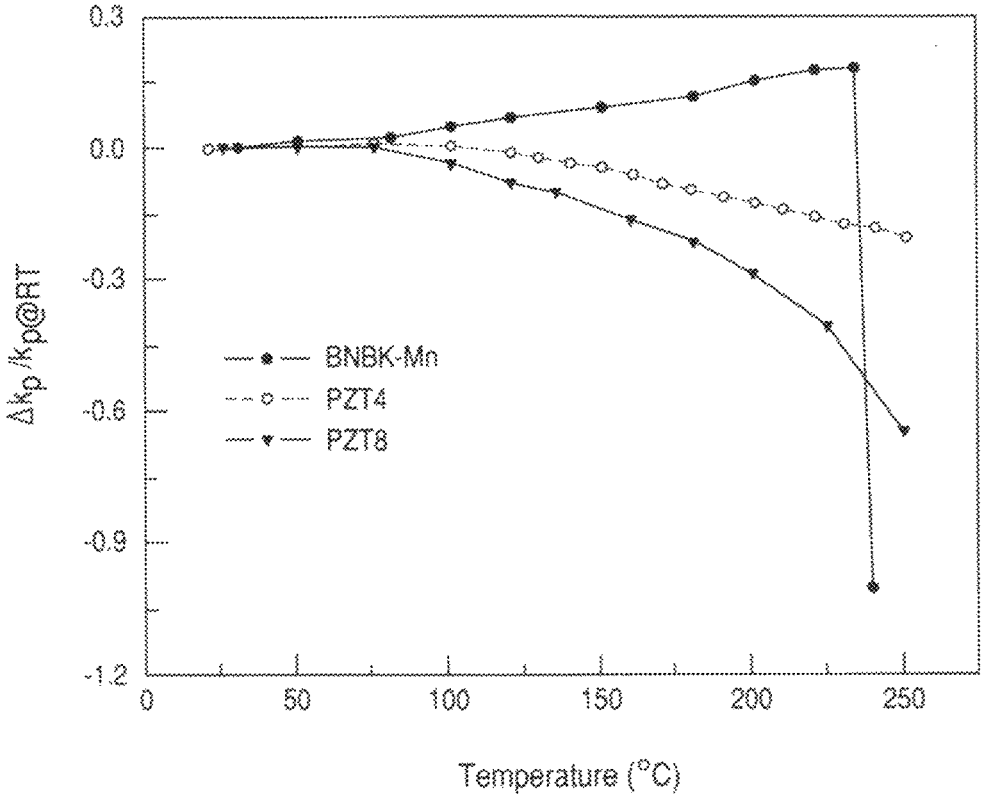

FIG. 5(a) shows dielectric permittivity and dielectric loss as a function of temperature for undoped BNBK 79 piezoelectric compounds at 1 kHz, 10 kHz and 100 kHz;

FIG. 5(b) shows dielectric permittivity and dielectric loss for 0.5 wt % $MnO_2$ doped BNBK 79 piezoelectric compounds at 1 kHz, 10 kHz and 100 kHz;

FIG. 5(c) shows dielectric permittivity and dielectric loss for 0.8 wt % $MnO_2$ doped BNBK 79 piezoelectric compounds at 1 kHz, 10 kHz and 100 kHz;

FIG. 5(d) shows dielectric permittivity and dielectric loss for 1.0 wt % $MnO_2$ doped BNBK 79 piezoelectric compounds at 1 kHz, 10 kHz and 100 kHz;

FIG. 6 shows electromechanical coupling factors in extensional mode and thickness mode for 0.8 wt % $MnO_2$ doped BNBK 79 of Example 1G piezoelectric compounds;

FIG. 7 shows variation of planar electromechanical coupling factor as a function of temperature for BNBK 79-0.8 wt % $MnO_2$ piezoelectric compounds compared to PZT4 and PZT8.

Figure 8A:
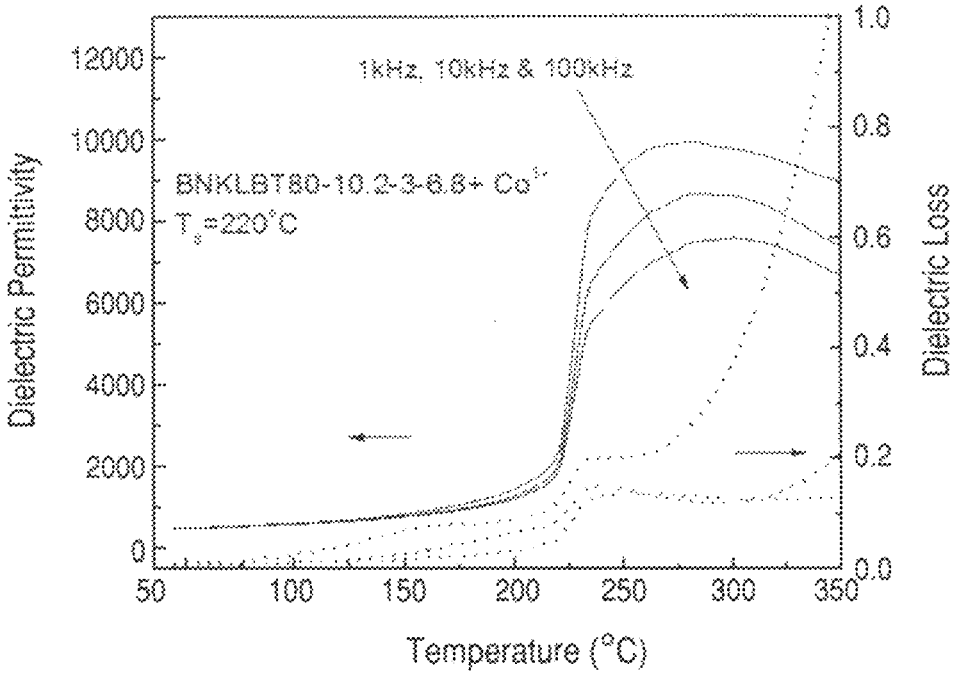
Figure 8B:
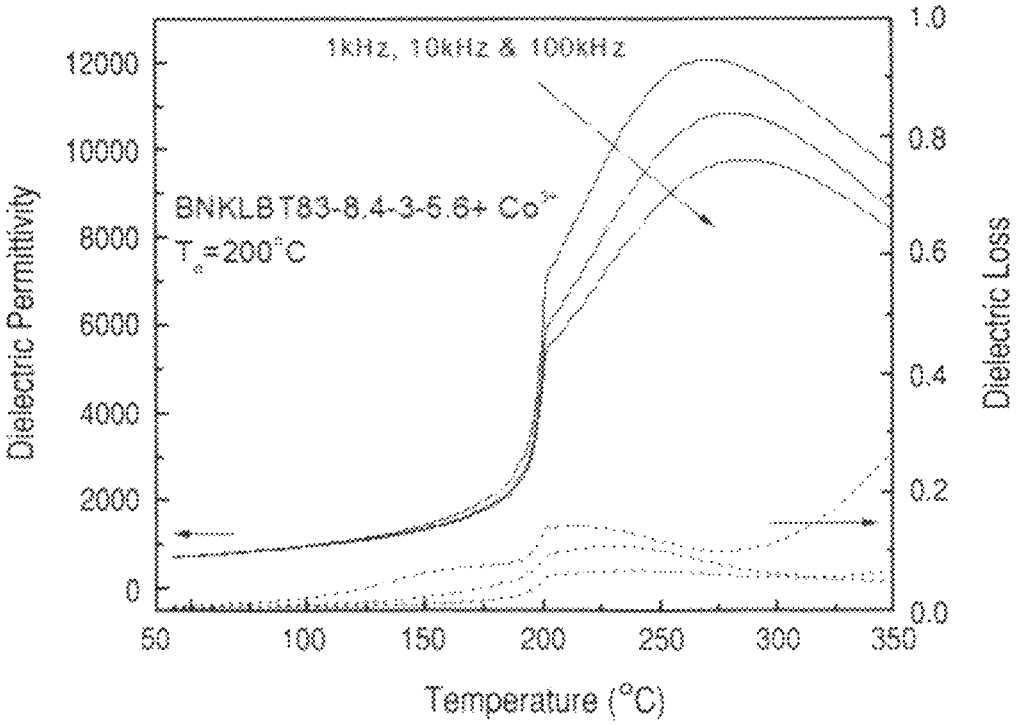
Figure 8C:
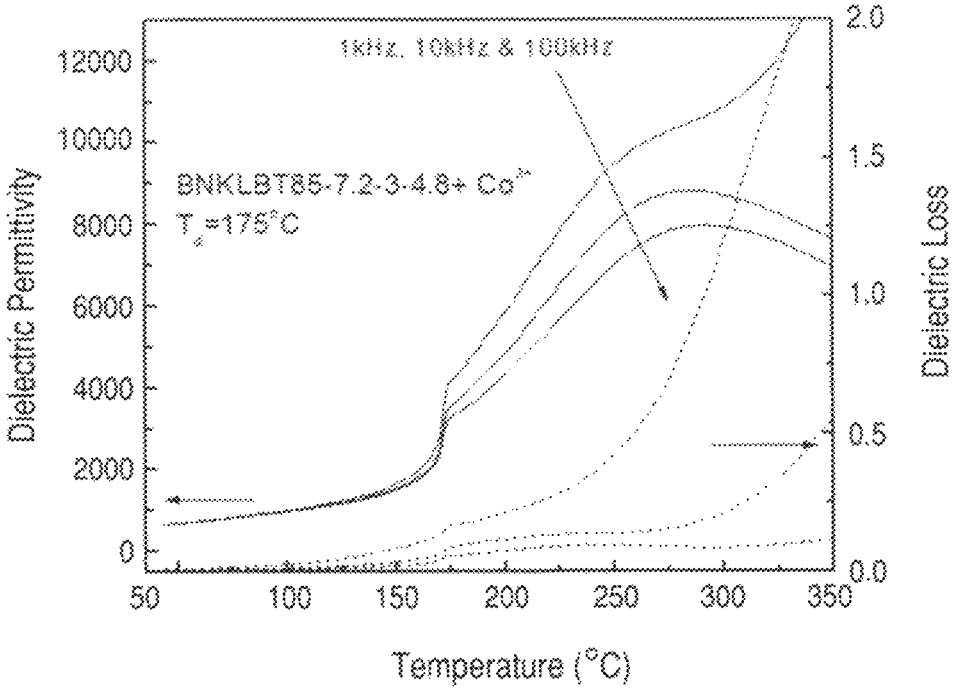

FIGS. 8(a)-8(c) show temperature dependence of dielectric behavior for $Co_2O_3$ doped vacancy defect engineered BNKLBT ceramics.

Figure 9:
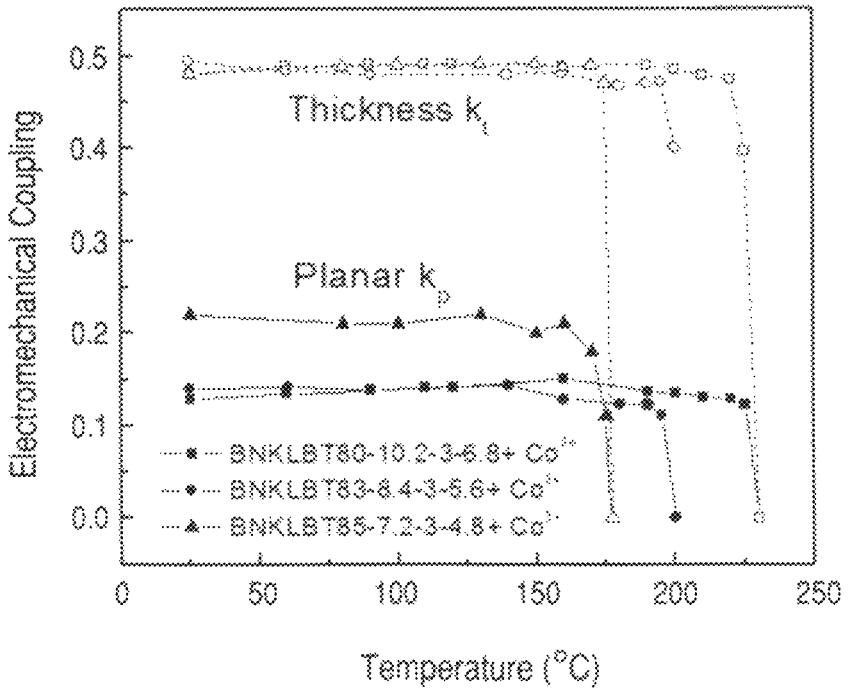

FIG. 9 shows temperature dependence of electromechanical coupling factor, including thickness coupling $k_t$ and planar coupling $k_p$, for $Co_2O_3$ doped vacancy defect engineered BNKLBT ceramics, exhibiting a very stable temperature behavior till their depolarization temperature $T_d$.

Figure 10:
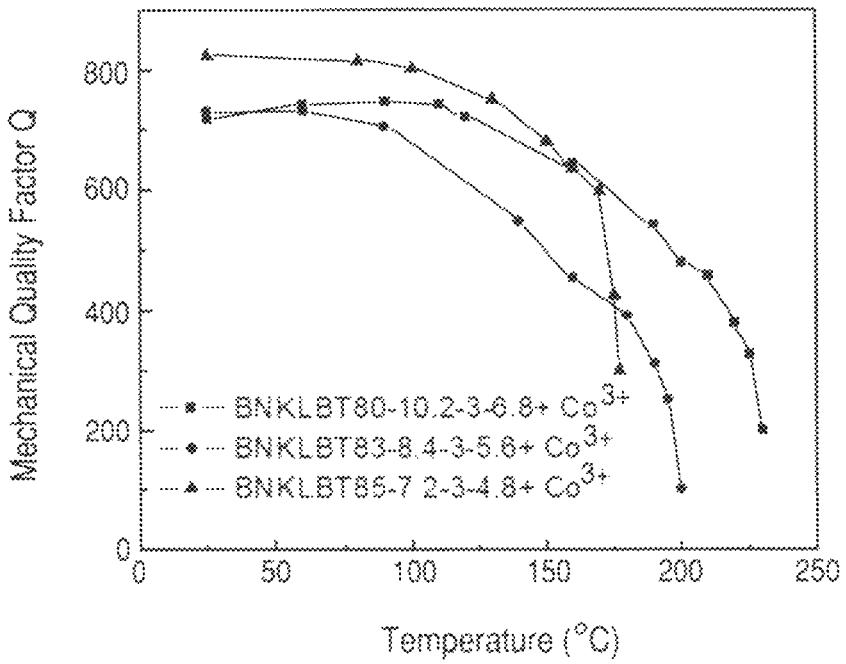

FIG. 10 shows the temperature dependence of mechanical quality factor Q, for $Co_2O_3$ doped vacancy defect engineered BNKLBT ceramics, where the Q values are larger than 700 at room temperature, gradually decreased with increasing temperature, keep yet high Q value around 200 when the temperature approaching the depolarization temperature $T_d$.

SUMMARY OF THE INVENTION

The NBT-based piezoelectric materials disclosed herein typically possess high internal bias field of more than about 5 kV/cm and high mechanical quality factor of more than about 700, comparable to PZT4 and PZT8. The NBT based materials of the general formula $xNa_mBi_nTiO_3$-$yK_mBi_nTiO_3$-$zLi_mBi_nTiO_3$-$pBaTiO_3$ where ($0<x\leq1$), preferably ($0.3\leq x\leq0.95$), more preferably ($0.3\leq x\leq0.8$), ($0\leq y\leq1$), preferably ($0\leq y\leq0.7$), more preferably ($0\leq y\leq0.2$), ($0\leq z\leq1$), preferably ($0\leq z\leq0.5$), more preferably ($0\leq z\leq0.2$); ($0.3\leq m\leq0.7$), preferably ($0.4\leq m\leq0.6$), more preferably ($0.45\leq m\leq0.55$); ($0.3\leq n\leq0.7$), preferably ($0.4\leq n\leq0.6$), more preferably ($0.45\leq n\leq0.55$) such as n=0.495; ($0<p<1$), preferably ($0<p\leq0.2$), more preferably ($0<p\leq0.1$); ($x+y+z+p=1$), ($0.9\leq m+n\leq1.1$) and ($0.9\leq m/n\leq1.1$), may be modified with various acceptor dopants (single dopant, multiple dopant) to have a wide temperature usage range of from about −50° C. to about 200° C. The low densities of NBT-based piezoelectric compounds, on the order of about 5.8 g/cc vs. about 7.6 g/cc for PZT piezoelectric compounds, enable the NBT-based piezoelectric compounds to achieve high acoustic velocities.

The NBT-based piezoelectric compounds possess improved "hardening" effect compared to conventional hard PZT piezoelectric compounds and may be used to replace lead containing piezoelectric materials such as PZT4 and PZT 8.

The NBT-based piezoelectric compounds are environmentally friendly materials that may be used in high power electronic devices such as high power ultrasonic transducers (probes), ultrasonic motors, piezoelectric transformers and high intensity focused ultrasound transducers.

DETAILED DESCRIPTION OF THE INVENTION

Figure 1:
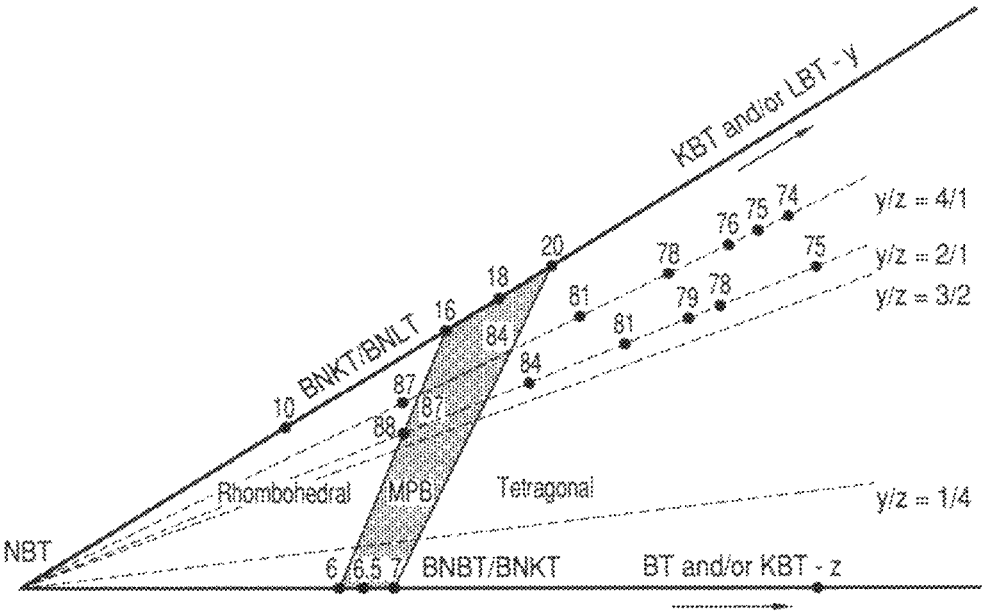
FIG. 1 shows a compositional diagram of NBT-based compositions.

In a first aspect, undoped compounds within the region bounded by $y\leq50\%$, $z\leq20\%$ shown in FIG. 1 may be produced. These compounds are within the general formula (I) $xNa_mBi_nTiO_3$-$yK_mBi_nTiO_3$-$zLi_mBi_nTiO_3$-$pBaTiO_3$ where ($0<x\leq1$), preferably ($0.3\leq x\leq0.95$), more preferably ($0.3\leq x\leq0.8$); ($0\leq y\leq1$), preferably ($0\leq y\leq0.7$), more preferably ($0<y\leq0.2$) and ($0\leq z\leq1$), preferably ($0\leq z\leq0.5$), more preferably ($0<z\leq0.2$); ($0.3\leq m\leq0.7$), preferably ($0.4\leq m\leq0.6$), more preferably ($0.45\leq m\leq0.55$); ($0.3\leq n\leq0.7$), preferably ($0.4\leq n\leq0.6$), more preferably ($0.45\leq n\leq0.55$); ($0<p<1$), preferably ($0<p\leq0.2$), more preferably ($0<p\leq0.1$), ($x+y+z+p=1$) and ($0.9\leq m/n\leq1.1$).

Starting materials which may be used include but are not limited to $K_2CO_3$ (99.9% pure from Alfa Aesar), $Na_2CO_3$ (99.9% pure from Alfa Aesar), $Li_2CO_3$ (99.9% pure from Alfa Aesar), $BaCO_3$ (99.9% pure from Alfa Aesar), $Bi_2O_3$ (99.99% pure from MCP) and $TiO_2$ (99.99% pure from Ishihara). Dopant sources which may be employed include but are not limited to $Al_2O_3$, CoO, $Co_2O_3$, $Re_2O_3$ (where Re is rare earth element), $NiCO_3$, $MnO_2$, $MnCO_3$, $Fe_2O_3$, and mixtures thereof. The dopants have a purity of 99.99% or more and are commercially available from sources such as Alfa Aesar.

Manufacture of piezoelectric compounds within general formula (I) entails use of starting materials such as those above that are dried at about 120° C. in air for about 10 hrs to about 20 hrs to remove moisture.

The dried starting materials are blended into a mixture for use in manufacture of undoped BNBK type compound such as $xNa_{0.5}Bi_{0.5}TiO_3$-$yK_{0.5}Bi_{0.5}TiO_3$-$zBaTiO_3$. The mixture then is calcined in an oxidizing atmosphere such as air at about 700° C. to about 950° C., preferably about 800° C. to about 900° C., more preferably about 850° C. to about 880° C. for about 0.5 hr to about 5 hrs, preferably about 1 hr to about 3 hrs, more preferably about 2 hrs to yield a calcined mixture. The calcined mixture then is vibration milled in a lower alkanol such as anhydrous ethanol to produce a milled material that has a particle size of about 0.5 micron to about 3 microns preferably about 1 micron to about 2 microns, more preferably about 1 micron.

The milled material is optionally mixed with up to about 2 wt. % of an optional organic binder based on the weight of milled material to produce a milled material composition. Useful binders include but are not limited to polyvinyl alcohol, polyvinyl butyral, and aqueous acrylic polymer emulsions such as Rhoplex from Rohm & Haas, polyethyleneimine and mixtures thereof. The milled material, optionally with binder composition is compressed at about 3000 PSI to about 10000 PSI, preferably about 5000 PSI to about 8000 PSI, more preferably about 5000 PSI to about 6000 PSI to yield a preform.

The preform is heated to about 500° C. to about 600° C., preferably about 350° C. to about 550° C., more preferably about 500° C. to about 550° C. to remove binder that may be present and to yield a green preform. The green preform then is sintered at about 1000° C. to about 1250° C., such as about 1060° C. to about 1220° C. preferably about 1050° C. to about 1150° C., more preferably about 1100° C. for about 0.5 hr to about 5 hrs, preferably about 1 hr to about 2 hrs, more preferably about 2 hrs to yield a sintered product.

The density of the sintered product typically is about 5.0 g/cm$^3$ to about 5.7 g/cm$^3$, preferably about 5.7 g/cm$^3$ which represents ≥95% of the theoretical density. The sintered products typically have a perovskite type crystal structure.

The sintered products are polished to a thickness of about 0.5 mm. The resulting polished products are electroded with fire-on-silver paste such a DuPont 6160 to produce an electroded sample. The electroded samples are poled at about 20° C. to about 120° C., preferably about 20° C. to about 50° C., more preferably about 25° C. (room temperature) with an electric field of about 30 kV/cm to about 60 kV/cm, preferably about 40 kV/cm to about 50 kV/cm, more preferably about 40 kV/cm for about 3 min to about 30 min, preferably about 5 min to about 10 min, more preferably about 10 min.

In a second aspect, doped piezoelectric compounds of the general formula (IA), $$((xNa_mBi_nTiO_3\text{-}yK_mBi_nTiO_3\text{-}zLi_mBi_nTiO_3\text{-}pBaTiO_3)rM) \quad \text{(IA)},$$

where (0<x≤1), preferably (0.3≤x≤0.95), more preferably (0.3≤x≤0.8); (0≤y≤1), preferably (0≤y≤0.7), more preferably (0≤y≤0.2), (0≤z≤1), preferably (0≤z≤0.5), more preferably (0≤z≤0.2); (0<p<1), preferably (0<p≤0.2), more preferably (0<p≤0.1); (x+y+z+p=1); 0.3≤m≤0.7, preferably 0.4≤m≤0.6, more preferably 0.45≤m≤0.55; 0.3≤n≤0.7, preferably 0.4≤n≤0.6, more preferably 0.45≤n≤0.55; and 0.9≤m/n≤1.1, preferably 0.95≤m/n≤1.05, more preferably 0.98≤m/n≤1.02 and (0 wt %<r≤5 wt %), preferably 0.2 wt %≤r≤2 wt %, more preferably 0.5 wt %≤r≤1 wt %, where r is based on the weight of a compound within the scope of $xNa_mBi_nTiO_3$-$yK_mBi_nTiO_3$-$zLi_mBi_nTiO_3$-$pBaTiO_3$ where x, y, z, m, n and p are defined as above, and M is a dopant such as $Al_2O_3$, CoO, $Re_2O_3$ where Re is a rare earth element, NiO, $MnO_2$, $Fe_2O_3$, and mixtures thereof may be produced.

In this second aspect, the starting materials are dried and then blended into a mixture for use in manufacture of undoped compound within the scope of general formula (I). The mixture then is calcined in an oxidizing atmosphere such as air at about 700° C. to about 950° C., preferably about 800° C. to about 900° C., more preferably about 850° C. to about 880° C. for about 0.5 hr to about 5 hrs, preferably about 1 hr to about 3 hrs, more preferably about 2 hrs to yield a calcined mixture. The calcined mixture then is blended with a dopant to provide a doped mixture suitable for manufacture of a compound with the general formula (IIA) that is vibration milled in a lower alkanol such as anhydrous ethanol to produce a milled material that has a particle size of about 0.5 micron to about 3 microns, preferably about 1 micron to about 2 microns, more preferably about 1 micron.

The milled material optionally may be mixed with an optional organic binder in an amount of up to about 2 wt. %, based on the weight of milled material to produce a milled material composition. Useful binders include but are not limited to polyvinyl alcohol, polyvinyl butyral, aqueous acrylic polymer emulsions such as Rhoplex from Rohm 86 Haas, polyethyleneimine and mixtures thereof.

The milled material composition is compressed at about 3000 PSI to about 10000 PSI, preferably about 5000 PSI to about 8000 PSI, more preferably about 5000 PSI to about 6000 PSI to yield a preform. The preform then is heated to about 500° C. to about 600° C., preferably about 350° C. to about 550° C., more preferably about 550° C. to remove binder that may be present and to yield a green preform. The green preform is sintered at about 1000° C. to about 1250° C., preferably about 1050° C. to about 1150° C., more preferably about 1100° C. for about 0.5 hr to about 5 hrs, preferably about 1 hr to about 2 hrs, more preferably about 2 hrs to yield a sintered product.

The sintered products are polished and electroded with fire-on-silver paste such as DuPont 6160 to produce electroded samples. The electroded samples are poled at about 20° C. to about 120° C., preferably about 20° C. to about 50° C., more preferably about 25° C. (room temperature) with an electric field of about 30 kV/cm to about 60 kV/cm, preferably about 40 kV/cm to about 50 kV/cm, more preferably about 40 kV/cm for about 3 min to about 30 min, preferably about 5 min to about 10 min, more preferably 10 min.

In a third aspect, compounds of the general formula (II)

$$xNa_mBi_nTiO_3\text{-}yK_mBi_nTiO_3\text{-}zLi_mBa_nTiO_3 \quad \text{(II)}$$

such as $xNa_{0.5}Bi_{0.5}TiO_3$-$yK_{0.5}Bi_{0.5}TiO_3$-$zLi_{0.5}Ba_{0.5}TiO_3$ where (0<x≤1), preferably (0.3≤x≤0.95), more preferably (0.30≤x≤0.8); (0<y≤1), preferably (0<y≤0.7), more preferably (0<y≤0.5), (0<z≤1), preferably (0<z≤0.5), more preferably (0<z≤0.2) (x+y+z=1); 0.3≤m≤0.7, preferably 0.4≤m≤0.6, more preferably 0.45≤m≤0.55; 0.3≤n≤0.7, preferably 0.4≤n≤0.6, more preferably 0.45≤n≤0.55; 0.9<m+n<1.1 and 0.9≤m/n≤1.1, preferably 0.95≤m/n≤1.05, more preferably 0.98≤m/n≤1.02 may be produced.

In this third aspect, dried starting materials such as $K_2CO_3$, $Na_2CO_3$, $TiO_2$, $Bi_2O_3$, $BaCO_3$ and $Li_2CO_3$ are blended into a mixture for use in manufacture of undoped piezoelectric compound within general formula (II). The mixture then is calcined in air at about 700° C. to about 950° C., preferably about 800° C. to about 900° C., more preferably about 850° C. to about 880° C. for about 0.5 hr to about 5 hrs, preferably about 1 hr to about 3 hrs, more preferably about 2 hrs to yield a calcined mixture.

The calcined mixture then is vibration milled in a lower alcohol such as anhydrous ethanol to produce a milled material that has a particle size of about 0.5 micron to about 3 microns, preferably about 1 micron to about 2 microns, more preferably about 1 micron. The milled material then is optionally mixed with up to about 2 wt. % of an organic binder based on the weight of milled material to produce a milled material composition. Useful binders include but are not limited to polyvinyl alcohol, polyvinyl butyral, aqueous acrylic polymer emulsions such as Rhoplex from Rohm & Haas, polyethyleneimine and mixtures thereof.

The milled material composition, optionally with binder, is compressed at about 3000 PSI to about 8000 PSI preferably about 5000 PSI to about 8000 PSI, more preferably about 5000 PSI to about 6000 PSI to yield a preform. The preform then is heated to about 500° C. to about 550° C., preferably about 550° C. to remove binder that may be present and to yield a green preform. The green preform then is sintered at about 1000° C. to about 1250° C., preferably about 1050° C. to about 1150° C., more preferably about 1100° C. for about 0.5 hrs to about 5 hrs, preferably about 1 hrs to about 2 hrs, more preferably about 2 hrs to yield a sintered product.

The sintered products are polished and electroded with fire-on-silver paste such a DuPont 6160 to produce electroded samples. The electroded samples are poled at about 20° C. to about 120° C., preferably about 20° C. to about 50° C., more preferably about 25° C. with an electric field of about 20 kV/cm to about 60 kV/cm, preferably about 40 kV/cm to about 50 kV/cm, more preferably about 40 kV/cm for about 3 min to about 30 minutes, preferably about 5 min to about 10 min, more preferably about 10 min.

In a fourth aspect, doped compounds within the general formula (IIA)

$$((xNa_mBi_nTiO_3\text{-}yK_mBi_nTiO_3\text{-}zLi_mBa_nTiO_3)\text{-}vN) \quad \text{(IIA)}$$

where ($0<x\leq1$), preferably ($0.3\leq x\leq0.9$), more preferably ($0.30\leq x\leq0.8$); ($0<y\leq1$), preferably ($0<y\leq0.7$), more preferably ($0<y\leq0.2$), ($0<z\leq1$), preferably ($0<z\leq0.5$), more preferably ($0<z\leq0.2$); ($x+y+z=1$), $0.3\leq m\leq0.7$, preferably $0.4\leq m\leq0.6$, more preferably $0.45\leq m\leq0.55$, $0.3\leq n\leq0.7$, preferably $0.4\leq n\leq0.6$, more preferably $0.45\leq n\leq0.55$; $0.9\leq m/n\leq1.1$, preferably $0.95\leq m/n\leq1.05$, more preferably $0.98\leq m/n\leq1.02$; $0.9<m+n<1.1$ and N is a dopant such as $Al_2O_3$, CoO, $Re_2O_3$ where Re is a rare earth element, NiO, $MnO_2$, $Fe_2O_3$, and mixtures thereof may be produced and ($0<v\leq5$ wt %) preferably 0.2 wt $\%\leq v\leq2$ wt %, more preferably 0.5 wt $\%\leq v\leq1$ wt %, where v is based on the weight of a compound within the scope of the formula $xNa_mBi_nTiO_3\text{-}yK_mBi_nTiO_3\text{-}zLi_mBa_nTiO_3$ where x, y, z, m and n are defined as above.

In this fourth aspect, starting materials are dried and then blended into a mixture for use in manufacture of undoped compounds within the scope of general formula (II). The mixture then is calcined in air at about 700° C. to about 950° C., preferably about 800° C. to about 900° C., more preferably about 850° C. to about 880° C. for about 0.5 hrs to about 3 hrs, preferably about 1 hr to about 2 hrs, more preferably about 2 hrs to yield a calcined mixture. The calcined mixture then is blended with a dopant to provide a doped mixture that is vibration milled in a lower alkanol such as anhydrous ethanol to produce a milled material that has a particle size of about 0.5 micron to about 3 microns, preferably about 1 micron to about 2 microns, more preferably about 1 micron.

The milled material optionally may be mixed with up to about 2 wt. % of an organic binder, based on the weight of milled material to produce a milled material composition. Useful binders include but are not limited to polyvinyl alcohol, polyvinyl butyral, aqueous acrylic polymer emulsions such as Rhoplex from Rohm 85 Haas, polyethyleneimine and mixtures thereof.

The milled material composition is compressed at about 3000 PSI to about 10000 PSI, preferably about 5000 PSI to about 8000 PSI, more preferably about 5000 PSI to about 6000 PSI to yield a preform. The preform then is heated to about 500° C. to about 700° C., preferably about 550° C. to remove any binder present to yield a green preform. The green preform then is sintered at about 1000° C. to about 1250° C., preferably about 1050° C. to about 1150° C., more preferably about 1100° C. for about 0.5 hr to about 5 hrs, preferably about 1 hr to about 2 hrs, more preferably about 2 hrs to yield a sintered product.

The sintered products are polished and electroded with fire-on-silver paste such a DuPont 6160 to produce an electroded sample. The electroded samples are poled at about 20° C. to about 120° C., preferably 20° C. to about 50° C., more preferably about 25° C. with an electric field of about 30 kV/cm to about 60 kV/cm, preferably about 40 kV/cm to about 50 kV/cm, more preferably about 40 kV/cm for about 3 min to about 30 min, preferably about 5 min to about 10 min, more preferably 10 min.

In a fifth aspect, compounds of the general formula (III)

$$(xNa_mBi_nTiO_3\text{-}yLi_mBi_nTiO_3\text{-}zBaTiO_3) \quad \text{(III)}$$

where ($0<x\leq1$), preferably ($0.3\leq x\leq0.95$), more preferably ($0.3\leq x\leq0.8$); ($0<y\leq1$), preferably ($0<y\leq0.7$), more preferably ($0<y\leq0.2$) and ($0<z\leq1$), preferably ($0<z\leq0.5$), more preferably ($0<z\leq0.2$); ($x+y+z=1$) $0.3\leq m\leq0.7$, preferably $0.4\leq m\leq0.6$, more preferably $0.45\leq m\leq0.55$; $0.3\leq n\leq0.7$, preferably $0.4\leq n\leq0.6$, more preferably $0.45\leq n\leq0.55$; $0.9<m+n<1.1$, and $0.9\leq m/n\leq1.1$, preferably $0.95\leq m/n\leq1.05$, more preferably $0.98\leq m/n\leq1.02$ may be produced.

Dried starting materials such as $Na_2CO_3$, $TiO_2$, $Bi_2O_3$, $BaCO_3$ and $Li_2CO_3$ are blended into a mixture for use in manufacture of undoped piezoelectric compounds within general formula (III) such as $xNa_{0.5}Bi_{0.5}TiO_3\text{-}yLi_{0.5}Bi_{0.5}TiO_3\text{-}zBaTiO_3$. The mixture then is calcined in air at about 700° C. to about 950° C., preferably about 800° C. to about 900° C., more preferably about 850° C. to about 880° C. for about 0.5 hr to about 2 hrs, preferably about 2 hrs yield a calcined mixture. The calcined mixture then is vibration milled in a lower alkanol such as anhydrous ethanol to produce a milled material that has a particle size of about 0.5 micron to about 3 microns, preferably about 1 micron to about 2 microns, more preferably about 2 microns. The milled material then is optionally mixed with up to about 2 wt. % of an organic binder based on the weight of milled material to produce a milled material composition. Useful binders include but are not limited to polyvinyl alcohol, polyvinyl butyral, aqueous acrylic polymer emulsions such as Rhoplex from Rohm & Haas, polyethyleneimine and mixtures thereof.

The milled material, optionally with binder, is compressed at about 3000 PSI to about 10000 PSI, preferably about 5000 PSI to about 8000 PSI, more preferably about 5000 PSI to about 6000 PSI to yield a preform. The preform then is heated to about 500° C. to about 650° C., preferably about 550° C. to remove binder that may be present and to yield a green preform. The green preform then is sintered at about 1000° C. to about 1250° C., preferably about 1050° C. to about 1150° C., more preferably about 1100° C. for about 0.5 hr to about 5 hrs, preferably about 1 hr to about 2 hrs, more preferably about 2 hrs to yield a sintered product.

The sintered products are polished and electroded with fire-on-silver paste such a DuPont 6160 to produce an electroded sample. The electroded samples are poled at about 20° C. to about 120° C., preferably about 20° C. to about 50° C., more preferably about 25° C. with an electric field of about 30 kV/cm to about 60 kV/cm, preferably about 40 kV/cm to about 50 kV/cm, more preferably about 40 kV/cm for about 3 min to about 30 min, preferably about 5 min to about 10 min, more preferably about 10 min.

In a sixth aspect, doped compounds of the general formula IIIA $$((xNa_mBi_nTiO_3\text{-}yLi_mBi_nTiO_3\text{-}zBaTiO_3)\text{-}wN) \quad \text{(IIIA)}$$

where ($0<x\leq1$), preferably ($0.3\leq x\leq0.95$), more preferably ($0.3\leq x\leq0.8$); ($0<y\leq1$), preferably ($0<y\leq0.7$), more preferably ($0<y\leq0.2$) and ($0<z\leq1$), preferably ($0<z\leq0.5$), more preferably ($0<z\leq0.2$), ($x+y+z=1$); $0.3\leq m\leq0.7$, preferably $0.4\leq m\leq0.6$, more preferably $0.45\leq m\leq0.55$; $0.3\leq n\leq0.7$, preferably $0.4\leq n\leq0.6$, more preferably $0.45\leq n\leq0.55$; $0.9<m+n<1.1$, and $0.9\leq m/n\leq1.1$, preferably $0.95\leq m/n\leq1.05$, more preferably $0.98\leq m/n\leq1.02$ ($0<w\leq5$ wt %) preferably 0.2 wt $\%\leq w\leq2$ wt %, more preferably 0.5 wt $\%\leq w\leq1$ wt %, where w is based on the weight of a compound within the scope of the formula $xNa_mBi_nTiO_3\text{-}yLi_mBi_nTiO_3\text{-}zBaTiO_3$ where x, y, z, m and n are defined as above and where N is a dopant such as $Al_2O_3$, CoO, $Re_2O_3$ where Re is a rare earth element, NiO, $MnO_2$, $Fe_2O_3$, and mixtures thereof.

In this sixth aspect, starting materials are dried and then blended into a mixture for use in manufacture of undoped piezoelectric compounds within general formula (III). The mixture then is calcined in air at about 700° C. to about 950° C., preferably about 800° C. to about 900° C., more preferably about 850° C. to about 880° C. for about 0.5 hr to about 5 hrs, preferably about 1 hr to about 3 hrs, more preferably about 2 hrs to yield a calcined mixture.

The calcined mixture then is blended with a dopant to provide a doped mixture that is vibration milled in a lower alkanol such as anhydrous ethanol to produce a milled material that has a particle size of about 0.5 micron to about 3 microns, preferably about 1 micron to about 2 microns, more preferably about 2 microns.

The milled material optionally may be mixed with an organic binder in an amount of up to about 2 wt. %, based on the weight of milled material to produce a milled material composition. Useful binders include but are not limited to polyvinyl alcohol, polyvinyl butyral, aqueous acrylic polymer emulsions such as Rhoplex from Rohm & Haas, polyethyleneimine and mixtures thereof. The milled material composition is compressed at about 3000 PSI to about 10000 PSI, preferably about 5000 PSI to about 8000 PSI, more preferably about 5000 PSI to about 6000 PSI to yield a preform.

The preform is heated to about 500° C. to about 650° C., preferably about 550° C. to remove binder that may be present to yield a green preform. The green preform then is sintered at about 1000° C. to about 1250° C., preferably about 1050° C. to about 1150° C., more preferably about 1100° C. about 0.5 hr to about 5 hrs, preferably about 1 hr to about 2 hrs, more preferably about 2 hrs to yield a sintered product.

The sintered products are polished and electroded with fire-on-silver paste such a DuPont 6160 to produce an electroded sample. The electroded samples are poled at room temperature with an electric field of about 30 kV/cm to about 60 kV/cm, preferably about 40 kV/cm to about 50 kV/cm, more preferably about 40 kV/cm for about 3 min to about 30 min, preferably about 5 min to about 10 min, more preferably about 10 min.

The invention is further described below by reference to the following, non-limiting examples.

Example 1A

Manufacture of an Undoped Piezoelectric Compound of the Formula $xNa_{0.5}Bi_{0.5}TiO_3$-$yK_{0.5}Bi_{0.5}TiO_3$-$pBaTiO_3$ where x is 0.79, y is 0.14, and p is 0.07, Hereinafter Referred to as BNBK79

0.64 gms $K_2CO_3$, 2.77 gms $Na_2CO_3$, 10.57 gms $TiO_2$, 14.19 gms $Bi_2O_3$ and 1.83 gms $BaCO_3$ are blended to yield a mixture. The mixture is calcined in air at 880° C. for 2 hrs to yield a calcined composition. The calcined composition then is vibration milled in anhydrous ethanol to produce a milled material that has a particle size of 1 micron. The milled material then is mixed with 2 wt. % Rhoplex binder from Rohm and Haas where the amount of binder is based on the weight of milled material. The resulting milled material-binder composition is compressed at 5000 PSI to yield a preform in the form of a disk that measures 12 mm diameter by 1 mm thick.

The preform is heated in air to 550° C. to burn out the binder and to yield a green preform. The green preform then is sintered in air at 1100° C. for 2 hrs to yield $xNa_{0.5}Bi_{0.5}TiO_3$-$yK_{0.5}Bi_{0.5}TiO_3$-$zBaTiO_3$ ($B_1NB_2K$) where x is 0.79, y is 0.14, and z is 0.07 sintered product. The sintered product is polished to 0.5 mm thickness and electroded with fire-on-silver paste (DuPont 6160) on the parallel faces for planar and thickness modes property characterizations. The electroded disks are poled at 30° C. with an applied field of 60 kV/cm for 5 min.

Example 1B

Manufacture of Piezoelectric Compound that has the Formula ($(xNa_{0.5}Bi_{0.5}TiO_3$-$yK_{0.5}Bi_{0.5}TiO_3$-$pBaTiO_3)$-0.5Mn) where x is 0.79, y is 0.14, and p is 0.07, Hereinafter Referred to as BNBK 79-0.5 wt % $MnO_2$ 0.64 gms $K_2CO_3$, 2.77 gms $Na_2CO_3$, 10.57 gms $TiO_2$ and 14.19 gms $Bi_2O_3$ and 1.83 gms $BaCO_3$ are blended to yield a mixture. The mixture then is calcined in air at 880° C. for 2 hours to yield a calcined composition. The calcined composition then is mixed with 0.14 gms $MnO_2$ (0.5 wt % $MnO_2$ based on the weight of the calcined composition) to yield a doped mixture. The doped mixture is vibration milled in anhydrous ethanol to produce a milled material that has a particle size of 1 micron. The milled material is mixed with 2 wt. % Rhoplex binder from Rohm and Haas where the amount of binder is based on the weight of milled material. The resulting milled material-binder composition is compressed at 5000 PSI to yield a preform in the form of a disk that measures 12 mm diameter by 1 mm thick. The preform is heated in air to 550° C. to burn out the binder and to yield a green preform. The green preform then is sintered in air at 1100° C. for 2 hrs to yield a sintered piezoelectric compound of the formula ($xNa_{0.5}Bi_{0.5}TiO_3$-$yK_{0.5}Bi_{0.5}TiO_3$-$zBaTiO_3$)-0.5Mn where x is 0.79, y is 0.14, and z is 0.07. The sintered product is polished to 0.5 mm thickness and electroded with fire-on-silver paste (DuPont 6160) on the parallel faces for planar mode property characterizations. The electroded disks are poled at 30° C. with an applied field of 60 kV/cm for 30 min.

Example 1C

Manufacture of Piezoelectric of the Formula ($xNa_{0.5}Bi_{0.5}TiO_3$-$yK_{0.5}Bi_{0.5}TiO_3$-$pBaTiO_3$)-0.7Mn where x is 0.79, y is 0.14, and p is 0.07 Hereinafter Referred to as BNBK 79-0.7 wt % $MnO_2$ The procedure of example 1B is followed except that 0.2 gms. $MnO_2$ is employed.

Example 1D

Manufacture of Piezoelectric of the Formula ($xNa_{0.5}Bi_{0.5}TiO_3$-$yK_{0.5}Bi_{0.5}TiO_3$-$pBaTiO_3$)-0.8Mn where x is 0.79, y is 0.14, and p is 0.07, Hereinafter Referred to as BNBK 79-0.8 wt % $MnO_2$ The procedure of example 1B is followed except that 0.23 gm of $MnO_2$ is employed.

Example 1E

Manufacture of Piezoelectric of the Formula ($xNa_{0.5}Bi_{0.5}TiO_3$-$yK_{0.5}Bi_{0.5}TiO_3$-$pBaTiO_3$)-1.0 wt. % Mn where x is 0.79, y is 0.14, and p is 0.07 Doped with 1.0 wt % $MnO_2$, Hereinafter Referred to as BNBK 79-1.0 wt % $MnO_2$ The procedure of example 1B is followed except that 0.28 gms. $MnO_2$ is employed.

Example 1F

Manufacture of Piezoelectric of the Formula ($xNa_{0.5}Bi_{0.5}TiO_3$-$yK_{0.5}Bi_{0.5}TiO_3$-$pBaTiO_3$)-1.0 wt % $CO_2O_3$ where x is 0.79, y is 0.14, and p is 0.07 Doped with 1.0 wt % $Co_2O_3$, Hereinafter Referred to as BNBK 79-1.0 wt % $CO_2O_3$ The procedure of example 1B is followed except that 0.28 gms. $Co_2O_3$ is used as a dopant instead of $MnO_2$.

Example 1G

Manufacture of Piezoelectric of the Formula ($xNa_{0.5}Bi_{0.495}TiO_3$-$yK_{0.5}Bi_{0.495}TiO_3$-$pBaTiO_3$)-0.8Mn where x is 0.79, y is 0.14, p is 0.07, Hereinafter Referred to as Vacancy Defect Engineered BNBK 79-0.8 wt % $MnO_2$ The procedure of example 1B is followed except that 14.05 gms $Bi_2O_3$ and 0.23 gms $MnO_2$ are employed.

Example 2

Manufacture of Piezoelectric of the Formula $xNa_{0.5}Bi_{0.5}TiO_3$-$yK_{0.5}Bi_{0.5}TiO_3$-$zLi_{0.5}Bi_{0.5}TiO_3$ where x=0.69, y=0.26 and z=0.05 Hereinafter Referred to as ("BNBKT")

The procedure of example 1A is followed except that 1.35 gms $K_2CO_3$, 2.74 gms $Na_2CO_3$, 0.14 gms $Li_2CO_3$, 14.40 gms $TiO_2$ and 17.30 gms $Bi_2O_3$ are employed.

Example 2A

Manufacture of Doped ($xNa_{0.5}Bi_{0.5}TiO_3$-$yK_{0.5}Bi_{0.5}TiO_3$-$zLi_{0.5}Bi_{0.5}TiO_3$)-$vMnO_2$ where x=0.69, y=0.26 z=0.05 and v=0.8 wt %, Hereinafter Referred to as ("BNBKTR")

The procedure of example 1B is followed except that 1.35 gms $K_2CO_3$, 2.74 gms $Na_2CO_3$, 0.14 gms $Li_2CO_3$, 14.40 gms $TiO_2$ and 17.30 gms $Bi_2O_3$ and 0.27 gm $MnO_2$ are employed.

Example 3

Manufacture of $xNa_{0.5}Bi_{0.5}TiO_3$-$zBaTiO_3$ (x+z=1) where x=0.8 and z=0.2

The procedure of example 1A is followed except that 3.26 gms $Na_2CO_3$, 12.31 gms $TiO_2$, 14.34 gms $Bi_2O_3$ and 6.06 gms $BaCO_3$ are used as starting materials.

Example 4

Manufacture of $xNa_{0.5}Bi_{0.5}TiO_3$-$yK_{0.5}Bi_{0.5}TiO_3$ (x+y=1) where x=0.7 and (y=0.3)

The procedure of example 1A is followed except that 1.59 gms $K_2CO_3$, 2.85 gms $Na_2CO_3$, 12.31 gms $TiO_2$, 17.92 gms $Bi_2O_3$ are employed as starting materials.

Example 5

Manufacture of $xNa_{0.5}Bi_{0.5}TiO_3$-$yK_{0.5}Bi_{0.5}TiO_3$-$zLi_{0.5}Bi_{0.5}TiO_3$-$pBaTiO_3$ (x+y+z+p=1) ("BNKLBT"), where x=0.83, y=0.084, z=0.03 and p=0.056

The procedure of example 1A is followed except that 0.445 gms $K_2CO_3$, 3.38 gms $Na_2CO_3$, 0.085 gms $Li_2CO_3$, 1.70 gms $BaCO_3$, 12.31 gms $TiO_2$ and 16.92 gms $Bi_2O_3$ are employed as starting materials.

Example 5A

Manufacture of ($xNa_{0.5}Bi_{0.5}TiO_3$-$yK_{0.5}Bi_{0.5}TiO_3$-$zLi_{0.5}Bi_{0.5}TiO_3$-$pBaTiO_3$)-$rCO_2O_3$ where x=0.83, y=0.084, z=0.03, p=0.056 and r=1.5 wt %

The procedure of example 1B is followed except that 0.445 gms $K_2CO_3$, 3.38 gms $Na_2CO_3$, 0.085 gms $Li_2CO_3$, 1.70 gms $BaCO_3$, 12.31 gms $TiO_2$, 16.92 gms $Bi_2O_3$ and 0.49 gms $CO_2O_3$ are employed as starting materials.

Example 6

Manufacture of Vacancy Defect Engineered ($xNa_{0.5}Bi_{0.495}TiO_3$-$yK_{0.5}Bi_{0.495}TiO_3$-$zLi_{0.5}Bi_{0.495}TiO_3$-$pBaTiO_3$)-$rCO_2O_3$, where x=0.83, y=0.084, z=0.03, p=0.056 and r=1.5 wt %

The procedure of example 1B is followed except that 0.445 gms $K_2CO_3$, 3.38 gms $Na_2CO_3$, 0.085 gms $Li_2CO_3$, 1.70 gms $BaCO_3$, 12.31 gms $TiO_2$, 16.75 gms $Bi_2O_3$ and 0.49 gms $CO_2O_3$ are employed as starting materials.

Example 7

$xNa_{0.5}Bi_{0.5}TiO_3$-$yK_{0.5}Bi_{0.5}TiO_3$-$zLi_{0.5}Bi_{0.5}TiO_3$-$pBaTiO_3$ (x+y+z+p=1) ("BNKLBT"), where x=0.85, y=0.072, z=0.03 and p=0.048

The procedure of example 1A is followed except that 0.38 gms $K_2CO_3$, 3.47 gms $Na_2CO_3$, 0.085 gms $Li_2CO_3$, 1.45 gms $BaCO_3$, 12.31 gms $TiO_2$, and 17.06 gms $Bi_2O_3$ are employed as starting materials.

Example 8

$xNa_{0.5}Bi_{0.5}TiO_3$-$yK_{0.5}Bi_{0.5}TiO_3$-$zLi_{0.5}Bi_{0.5}TiO_3$-$pBaTiO_3$ (x+y+z+p=1) ("BNKLBT"), where x=0.80, y=0.102, z=0.03 and p=0.068

The procedure of example 1A is followed except that 0.54 gms $K_2CO_3$, 3.26 gms $Na_2CO_3$, 0.085 gms $Li_2CO_3$, 2.06 gms $BaCO_3$, 12.31 gms $TiO_2$, and 16.70 gms $Bi_2O_3$ are employed as starting materials.

Example 9

($xNa_{0.5}Bi_{0.5}TiO_3$-$yK_{0.5}Bi_{0.5}TiO_3$-$zLi_{0.5}Bi_{0.5}TiO_3$-$pBaTiO_3$)-$rCo_2O_3$, r=1.5%, (x+y+z+p=1) where x=0.85, y=0.072, z=0.03 and p=0.048

The procedure of example 1B is followed except that 0.38 gms $K_2CO_3$, 3.47 gms $Na_2CO_3$, 0.085 gms $Li_2CO_3$, 1.45 gms $BaCO_3$, 12.31 gms $TiO_2$, 17.06 gms $Bi_2O_3$ and 0.49 gms $CO_2O_3$ are employed as starting materials.

Example 10

$(xNa_{0.5}Bi_{0.5}TiO_3\text{-}yK_{0.5}Bi_{0.5}TiO_3\text{-}zLi_{0.5}Bi_{0.5}TiO_3\text{-}pBaTiO_3)\text{-}rCo_2O_3$, r=1.5%, (x+y+z+p=1) where x=0.80, y=0.102, z=0.03 and p=0.068

The procedure of example 1B is followed except that 0.54 gms $K_2CO_3$, 3.26 gms $Na_2CO_3$, $0.085Li_2CO_3$, 2.06 gms $BaCO_3$, 12.31 gms $TiO_2$, 16.70 gms $Bi_2O_3$ and 0.49 gms $CO_2O_3$ are employed as starting materials.

Figure 3:
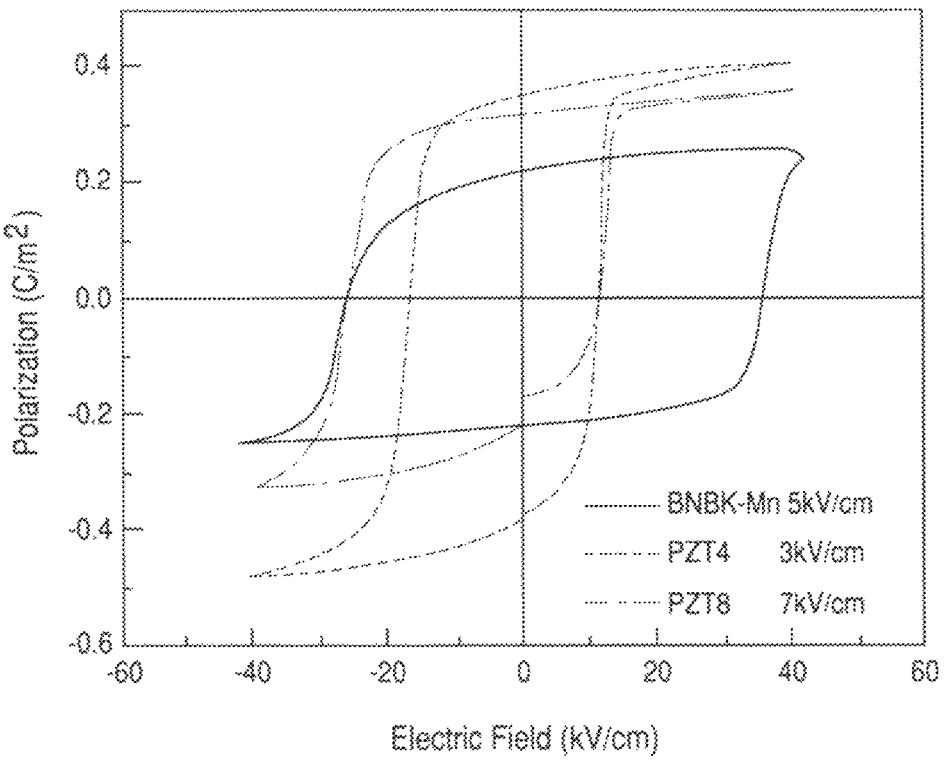
FIG. 3 shows polarization hysteresis for BNBK 79-0.8 wt % $MnO_2$ piezoelectric compound of example 1G compared to PZT4 and PZT8.

Various properties of BNBK type ceramics as compared to commercial PZT ceramics is shown in Tables II, III and IV. The polarization hysteresis for BNBK 79-0.8 wt % $MnO_2$ piezoelectric compound of example 1G compared to PZT4 and PZT8 is shown in FIG. 3;

TABLE II

Characteristic piezoelectric properties of BNBK lead free ceramics compared to commercial hard PZT.

| Material | Tc (° C.) | Td (° C.) | $\epsilon_{33}^T/\epsilon_0$ | loss | $P_r$ (C/m$^2$) | $E_C$ (kV/cm) | $E_i$ (kV/cm) | $d_{33}$ (pC/N) | $k_{33}$ | Q | r (g/cc) | $v_3^D$ (m/s) |
|---|---|---|---|---|---|---|---|---|---|---|---|---|
| Ex. 1G BNBK-Mn | 285 | 232 | 510 | 0.6% | 0.22 | 37.0 | 6 | 96 | 0.46 | 1100 | 5.8 | 5070 |
| Ex. 1A BNBK79 | 280 | 224 | 650 | 4.0% | 0.29 | 25.0 | 0 | 135 | 0.54 | 110 | 5.7 | — |
| PZT4 | 328 | — | 1300 | 0.4% | 0.36 | 14.2 | 3 | 289 | 0.70 | 500 | 7.6 | 4570 |
| PZT8 | 300 | — | 1000 | 0.4% | 0.27 | 19.0 | 7 | 225 | 0.64 | 1000 | 7.6 | 4600 |

TABLE III

Elastic compliance $s_{ij}$ ($10^{-12}$ m$^2$/N) , elastic stiffness $c_{ij}$ ($10^{10}$ N/m$^2$) constants, Piezoelectric Coefficients, $d_{ij}$ (pC/N) , $e_{ij}$ {C/m$^2$), $g_{ij}$ ($10^{-3}$ Vm/N), $h_{ij}$ ($10^8$ V/m), $d_h$ (pC/N), Electromechanical Coupling Factors $k_{ij}$, Dielectric Constants, $\epsilon_{ij}$ ($\epsilon_o$), and Dielectric Impermeability Constants, $\beta$ ($10^{-4}/\epsilon_o$), for hard BNBK lead free ceramics and compared to hard PZT.

| EX. | Material | $s_{11}^E$ | $s_{12}^E$ | $s_{13}^E$ | $s_{33}^E$ | $s_{44}^E$ | $s_{66}^E$ | $s_{11}^D$ | $s_{12}^D$ | $s_{13}^D$ | $s_{33}^D$ | $s_{44}^D$ | $s_{66}^D$ |
|---|---|---|---|---|---|---|---|---|---|---|---|---|---|
| 1G | BNBK-Mn | 9.2 | −2.1 | −2.5 | 10.1 | 22.0 | 22.6 | 9.2 | −2.1 | −2.2 | 8.0 | 16.5 | 22.6 |
| | PZT4 | 12.3 | −4.1 | −5.2 | 15.5 | 39.0 | 32.7 | 10.9 | −5.4 | −2.1 | 7.9 | 19.3 | 32.7 |
| | PZT8 | 11.5 | −3.4 | −4.8 | 13.5 | 31.9 | 29.8 | 10.4 | −4.4 | −2.3 | 8.0 | 22.6 | 29.8 |

| EX. | Material | $c_{11}^E$ | $c_{12}^E$ | $c_{13}^E$ | $c_{33}^E$ | $c_{44}^E$ | $c_{66}^E$ | $c_{11}^D$ | $c_{12}^D$ | $c_{13}^D$ | $c_{33}^D$ | $c_{44}^D$ | $c_{66}^D$ |
|---|---|---|---|---|---|---|---|---|---|---|---|---|---|
| 1G | BNBK-Mn | 12.9 | 4.1 | 4.2 | 12.0 | 4.5 | 4.4 | 12.9 | 4.1 | 4.1 | 14.9 | 6.1 | 4.4 |
| | PZT4 | 13.9 | 7.6 | 7.1 | 11.5 | 2.6 | 3.1 | 14.5 | 8.0 | 5.7 | 15.9 | 5.2 | 3.1 |
| | PZT8 | 13.7 | 7.2 | 7.5 | 12.3 | 3.1 | 3.4 | 14.0 | 7.5 | 6.4 | 16.1 | 4.4 | 3.4 |

| EX. | Material | $d_{33}$ | $d_{31}$ | $d_{15}$ | $e_{33}$ | $e_{31}$ | $e_{15}$ | $g_{33}$ | $g_{31}$ | $g_{15}$ | $h_{33}$ | $h_{31}$ | $h_{15}$ |
|---|---|---|---|---|---|---|---|---|---|---|---|---|---|
| 1G | BNBK-Mn | 96 | −15 | 153 | 10.1 | −0.3 | 6.9 | 21.2 | −3.3 | 33.3 | 28.4 | −0.9 | 20.0 |
| | PZT4 | 289 | −126 | 496 | 15.1 | −5.2 | 12.7 | 25.1 | −10.7 | 38.0 | 26.9 | −9.3 | 19.7 |
| | PZT8 | 225 | −97 | 330 | 13.2 | −4.0 | 10.4 | 25.4 | −10.9 | 29.0 | 25.7 | −7.8 | 13.1 |

| EX. | Material | $k_{33}$ | $k_{31}$ | $k_{15}$ | $k_t$ | $k_p$ | $\epsilon_{33}^T$ | $\epsilon_{11}^T$ | $\epsilon_{33}^S$ | $\epsilon_{11}^S$ | $\beta_{33}^T$ | $\beta_{11}^T$ | $\beta_{33}^S$ | $\beta_{11}^S$ |
|---|---|---|---|---|---|---|---|---|---|---|---|---|---|---|
| 1G | BNBK-Mn | 0.46 | 0.07 | 0.50 | 0.44 | 0.12 | 510 | 460 | 345 | 404 | 19.6 | 21.7 | 25.0 | 29.0 |
| | PZT4 | 0.70 | 0.33 | 0.71 | 0.51 | 0.58 | 1300 | 1475 | 635 | 730 | 7.7 | 6.8 | 15.8 | 13.7 |
| | PZT8 | 0.64 | 0.30 | 0.55 | 0.48 | 0.51 | 1000 | 1290 | 580 | 900 | 10.0 | 7.8 | 17.2 | 11.1 |

Table III, as presented above, shows material constants for vacancy defect engineered BNBK 79-0.8 wt % $MnO_2$ piezoelectric compound of Example 1G compared to PZT4 and PZT8 hard ceramics, measured according to IEEE Standards on Piezoelectricity.

Table IV as presented above, shows characteristic properties of xNBT-yKBT-zLBT-pBT lead free ceramics without and with dopant $CO_2O_3$.

Figure 2:
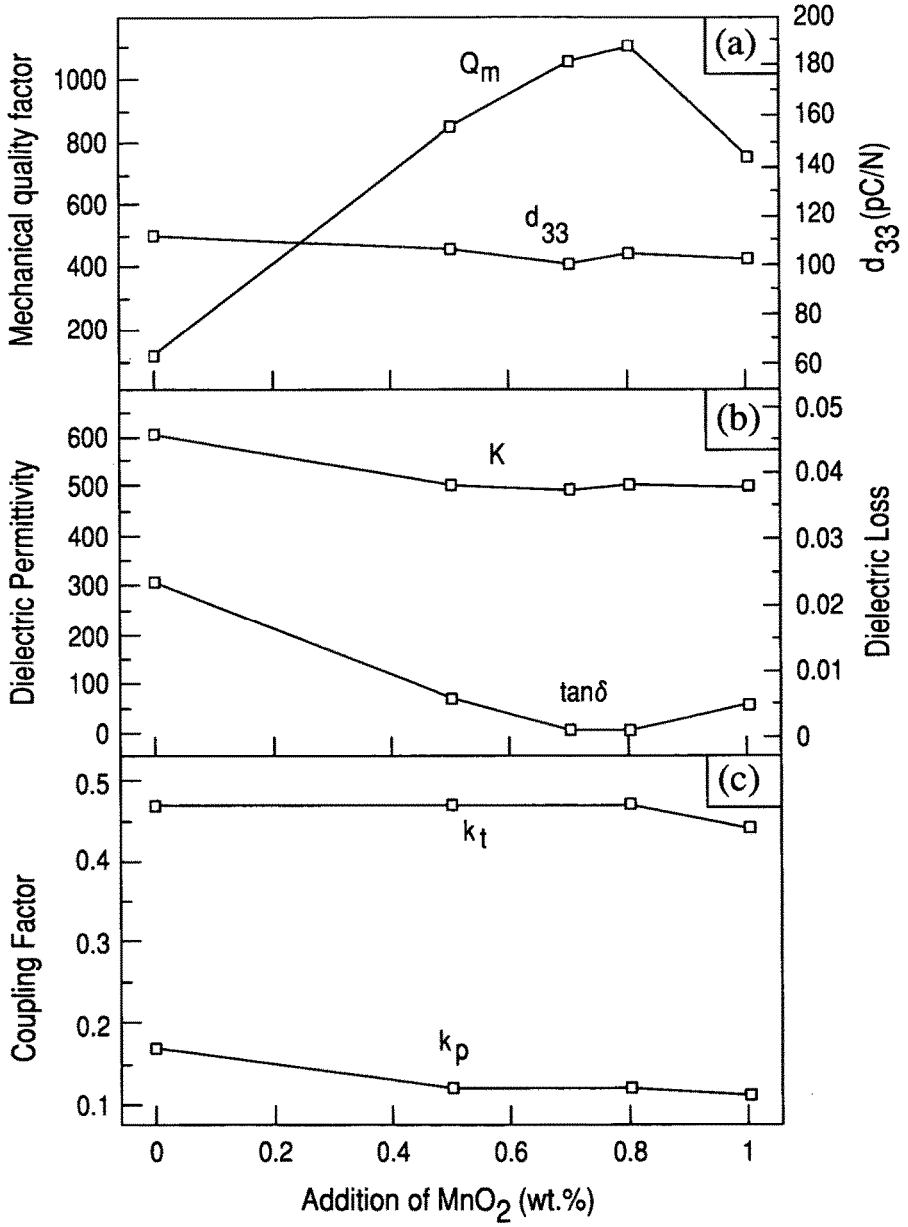
FIG. 2 (a) shows piezoelectric coefficient ($d_{33}$) and mechanical quality factor ($Q_m$) as a function of Mn level in BNBK 79 piezoelectric compounds.

FIG. 2 and Table V show various properties of $MnO_2$ doped NBT piezoelectric materials of examples 1A-1E.

TABLE IV

Characteristic piezoelectric properties of pure and Co-doped (1.5 wt % $Co_2O_3$) xNBT-yKBT-zLBT-pBT (abbreviated as xN-yK-zL-pBT) lead free ceramics.

| EX. | | $T_C$ (° C.) | $T_d$ (° C.) | $\epsilon_{33}^T/\epsilon_0$ | loss | $P_r$ (C/m$^2$) | $E_C$ (kV/cm) | $E_i$ (kV/cm) | $d_{33}$ (pC/N) | $k_p$ | $k_t$ | Q |
|---|---|---|---|---|---|---|---|---|---|---|---|---|
| | xN-yK-zL-pBT | | | | | | | | | | | |
| Ex. 5 | 83-8.4-3-5.6 | 280 | 188 | 890 | 3% | 25 | 30 | — | 170 | 0.17 | 0.49 | 100 |
| Ex. 7 | 85-7.2-3-4.8 | 290 | 120 | 970 | 3% | 30 | 30 | — | 190 | 0.25 | 0.50 | 100 |
| Ex. 8 | 80-10.2-3-6.8 | 265 | 210 | 830 | 3% | 22 | 30 | — | 150 | 0.17 | 0.49 | 90 |
| | $Co_2O_3$-doped | | | | | | | | | | | |
| Ex. 5A | 83-8.4-3-5.6 | 280 | 200 | 650 | 0.7% | 23 | 36 | 6 | 120 | 0.15 | 0.48 | 700 |
| Ex. 9 | 85-7.2-3-4.8 | 285 | 175 | 600 | 0.6% | 30 | 35 | 3 | 140 | 0.22 | 0.51 | 700 |
| Ex. 10 | 80-10.2-3-6.8 | 285 | 220 | 510 | 0.6% | 21 | 32 | 5 | 110 | 0.10 | 0.49 | 800 |

TABLE V

| Ex. | $MnO_2$ (wt %) | Mechanical quality factor | Piezoelectric d coefficient | dielectric constant | dielectric loss | thickness mode coupling | planar mode coupling |
|---|---|---|---|---|---|---|---|
| 1A | 0 | 120 | 118 | 610 | 0.025 | 0.48 | 0.18 |
| 1B | 0.5 | 850 | 105 | 520 | 0.006 | 0.48 | 0.12 |
| 1C | 0.7 | 1050 | 100 | 490 | 0.004 | 0.48 | 0.11 |
| 1D | 0.8 | 1100 | 104 | 500 | 0.004 | 0.49 | 0.11 |
| 1E | 1 | 769 | 102 | 480 | 0.005 | 0.46 | 0.11 |

Figure 4:
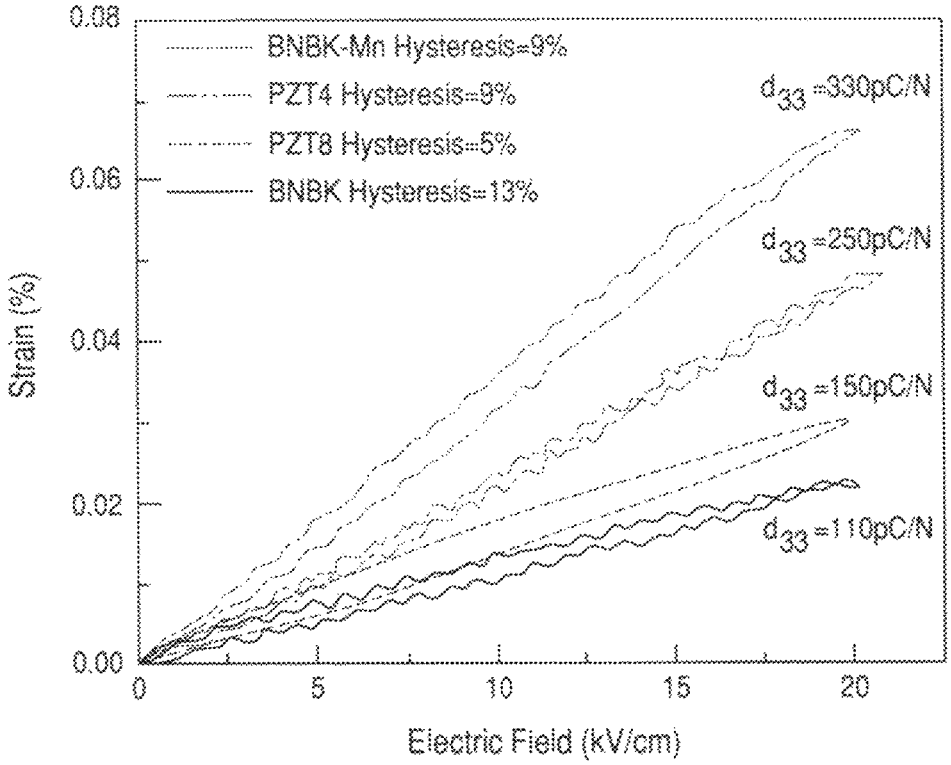
FIG. 4 shows strain hysteresis of lead free BNBK 79 of example 1A and 0.8 wt % $MnO_2$ doped BNBK 79 of example 1G piezoelectric compounds compared to PZT4 and PZT8.

FIG. 3 shows polarization hysteresis for BNBK 79-0.8 wt % $MnO_2$ piezoelectric compound of example 1G compared to PZT4 and PZT8;

FIG. 4 shows strain hysteresis of lead free BNBK 79 of example 1A and 0.8 wt % $MnO_2$ doped BNBK 79 of example 1G piezoelectric compounds compared to PZT4 and PZT8;

FIG. 5 (a) shows temperature dependence of dielectric behavior for undoped BNBK 79 of example 1A. FIGS. 5(b)-(d) show temperature dependence of dielectric behavior for Mn doped BNBK79 piezoelectric compounds of examples 1B, 1D and 1E respectively. As shown in FIGS. 5(a)-5(d), depolarization temperature ($T_d$) decreases slightly from 250° C. to 230° C. with increasing Mn dopant level.

FIG. 6 shows temperature dependence of electromechanical coupling factors ($k_{ij}$) for vacancy defect engineered 0.8 wt. % $MnO_2$ doped BNBK79 piezoelectric compound of example 1G. Lateral coupling factor $k_{31}$ is 7% at room temperature and thickness coupling factor $k_t$ is 44% at room temperature. As shown in FIG. 6, $k_{31}$ increases to 10% at 235° C. and $k_t$ increases to 50% at 235° C.

FIG. 7 shows planar electromechanical coupling factor variation as a function of temperature for vacancy defect engineered BNBK79-0.8 wt % $MnO_2$ piezoelectric compound of Example 1G compared to PZT 4 and PZT8. As shown in FIG. 7, planar electromechanical coupling factor increases slightly with temperature up to 235° C., whereas the coupling factor of PZT4 and PZT8 ceramics decrease continuously, dropping by 25%-50% at the same temperature.

FIGS. 8 (a)-8(c) show temperature dependence of dielectric behavior for $CO_2O_3$ doped vacancy defect engineered BNKLBT ceramics of examples 10, 5A and 9, respectively.

FIG. 9 shows temperature dependence of electromechanical coupling factor, including thickness coupling $k_t$ and planar coupling $k_p$, for $Co_2O_3$ doped vacancy defect engineered BNKLBT ceramics of examples 10, 5A and 9, exhibiting a very stable temperature behavior till their depolarization temperature $T_d$.

FIG. 10 shows the temperature dependence of mechanical quality factor Q, for $Co_2O_3$ doped vacancy defect engineered BNKLBT ceramics of examples 10, 5A and 9, where the Q values are larger than 700 at room temperature, gradually decreased with increasing temperature, keep yet high Q value around 200 when the temperature approaching the depolarization temperature $T_d$.

The disclosed piezoelectric compounds may be employed in electronic devices such as ultrasonic transducers that typically operate at 20 kHz and above as well as in high intensity focused ultrasound (HIFU) transducers. The disclosed piezoelectric compounds also may be employed as stators in ultrasonic motors and as components in piezoelectric transformers.

Ultrasonic motors, and their construction, are well known as shown in U.S. Pat. No. 7,576,472, the teachings of which are incorporated by reference herein by their entirety. Piezoelectric transformers and their construction also are known, as shown by U.S. Pat. No. 7,593,241, the teachings of which are incorporated by reference herein by their entirety.

The invention claimed is:

1. A piezoelectric compound having [the] formula $xNa_mBi_nTiO_3$-$yK_mBi_nTiO_3$-$zLi_mBi_nTiO_3$-$pBaTiO_3$ where

[(0<x≤1), (0≤y≤1), (0≤z≤1), (0<p<1,] *(0<x≤0.85), (0<y<1) (0<z<1), (0<p<1),* (x+y+z+p=1), (0.3≤m≤0.7), (0.3≤n≤0.7), *and* (0.9≤m/n≤1.1).

2. A piezoelectric compound having [the] formula ($(xNa_mBi_nTiO_3\text{-}yK_mBi_nTiO_3\text{-}zLi_mBi_nTiO_3\text{-}pBaTiO_3)\text{-}rM$) where [(0<x≤1), (0≤y≤1), (0<z≤1), (0<p<1),] *(0<x≤0.85), (0<y<1), (0<z<1), (0<p<1),* (x+y+z+p=1), (0.3≤m≤0.7), (0.3≤n≤0.7), (0.9≤m/n≤1.1) and (0 wt %<r≤5 wt %) where r is based on the weight of a compound within [the scope of] *formula* $xNa_mBi_nTiO_3\text{-}yK_mBi_nTiO_3\text{-}zLi_mBi_nTiO_3\text{-}pBaTiO_3$ and M is a dopant selected from the group consisting of $Al_2O_3$, CoO, $Re_2O_3$ where Re is a rare earth element, NiO, $MnO_2$, $Fe_2O_3$, and mixtures thereof.

3. A piezoelectric compound having [the] formula $$(xNa_mBi_nTiO_3\text{-}yLi_mBi_nTiO_3\text{-}zBaTiO_3) \quad \text{[(III)]}$$

where [(0<x≤1), (0<y≤1), (0<z≤1),] *(0<x<1), (0.2≤y<1), (0<z<1),* (x+y+z=1), (0.3≤m≤0.7), (0.3≤n≤0.7), (0.9<m+n<1.1) and (0.9≤m/n≤1.1).

4. A piezoelectric compound having [the] formula ($(xNa_mBi_nTiO_3\text{-}yLi_mBi_nTiO_3\text{-}zBaTiO_3)\text{-}wN$) where [(0<x≤1), (0<y≤1), (0<z≤1),] *(0<x<1), (0<y<1), (0<z<1),* (x+y+z=1), (0.3≤m≤0.7), (0.3≤n≤0.7), (0.9<m+n<1.1), (0.9<m/n<1.1) and (0<w≤5 wt %) where w is based on the weight of a compound within [the scope of] the formula $xNa_mBi_nTiO_3\text{-}yLi_mBi_nTiO_3\text{-}zBaTiO_3$ and where N is a dopant selected from the group consisting of $Al_2O_3$, CoO, $Re_2O_3$ where Re is a rare earth element, NiO, $MnO_2$, $Fe_2O_3$, and mixtures thereof.

5. A piezoelectric compound having [the] formula ($(xNa_mBi_nTiO_3\text{-}yK_mBi_nTiO_3\text{-}zLi_mBi_nTiO_3\text{-}pBaTiO_3)\text{-}rM$) where [(0<x≤1), (0≤y≤1), (0<p<1),] *(0<x<1), (0<y<1), (0<p<1),* (0<z≤0.2) (x+y+z+p=1), (0.3≤m≤0.7), (0.3≤n≤0.7), (0.9≤m/n≤1.1) and (0 wt %<r≤5 wt %) where r is based on the weight of a compound within [the scope of] *formula* $xNa_mBi_nTiO_3\text{-}yK_mBi_nTiO_3\text{-}zLi_mBi_nTiO_3\text{-}pBaTiO_3$ and M is a dopant selected from the group consisting of $Al_2O_3$, CoO, $Re_2O_3$ where Re is a rare earth element, NiO, *$MnO_2$,* $Fe_2O_3$ and mixtures thereof.

6. The compound of claim 5 wherein m=0.5 and n=0.495.

7. The compound of claim 2 wherein *a source of* M is $Co_2O_3$, x is 0.80, y is 0.102, z is 0.03, p is 0.068 and r is 1.5%.

8. The compound of claim 7 wherein m=0.5 and n=0.495.

9. A piezoelectric compound having [the] formula $xNa_{0.5}Bi_{0.5}TiO_3\text{-}yLi_{0.5}Bi_{0.5}TiO_3\text{-}zBaTiO_3$ where (0.3≤x≤0.95), [(0<y≤0.7),] *(0.2≤y≤0.7),* (0<z≤0.2) and (x+y+z=1).

10. A method of manufacture of a piezoelectric compound of [the] formula $xNa_{0.5}Bi_{0.5}TiO_3\text{-}yK_{0.5}Bi_{0.5}TiO_3\text{-}zBaTiO_3$ where [(0<x≤1), (0<y≤1), (0<z≤1)] *(0<x<1), (0.7<y<1), (0<z<1),* and (x+y+z=1) comprising, forming a mixture of $K_2CO_3$, $Na_2CO_3$, $BaCO_3$, $Bi_2O_3$ [or] *and* $TiO_2$ starting materials in amounts suitable for yielding a compound within *formula* $xNa_{0.5}Bi_{0.5}TiO_3\text{-}yK_{0.5}Bi_{0.5}TiO_3\text{-}zBaTiO_3$, calcining the mixture at about 800° C. to about 950° C. for about 0.5 hrs to about 2 hrs to yield a calcined mixture, milling the calcined mixture to a particle size of about 0.5 microns to about 2 microns to produce a [calcined] *milled* mixture, compressing the [calcined] *milled* mixture at about 3000 PSI to about 10000 PSI to yield a preform, heating the preform to *a temperature of* about 500° C. to about 600° C. to yield a green preform, sintering the green preform at about 1060° C. to about 1220° C. for about 0.5 hrs to about 2 hrs to yield a piezoelectric compound of the formula $xNa_{0.5}Bi_{0.5}TiO_3\text{-}yK_{0.5}Bi_{0.5}TiO_3\text{-}zBaTiO_3$ where [(0<x≤1), (0<y≤1), (0<z≤1)] *(0<x<1), (0.7<y<1), (0<z<1),* and (x+y+z=1).

11. A method of manufacture of a piezoelectric compound of [the] formula ($(xNa_{0.5}Bi_{0.5}TiO_3\text{-}yK_{0.5}Bi_{0.5}TiO_3\text{-}zBaTiO_3)\text{-}rM$ where [(0<x≤1), (0<y≤1), (0<z≤1),] *(0<x<1), (0<y<1), 0<z<1),* (x+y+z=1), (0<r≤5 wt %) *where r is based on the weight of a compound within formula* $xNa_{0.5}Bi_{0.5}TiO_3\text{-}yK_{0.5}Bi_{0.5}TiO_3\text{-}zBaTiO_3$ and M is a dopant [comprising,] *wherein the method comprises* forming a mixture of $K_2CO_3$, $Na_2CO_3$, $BaCO_3$, $Bi_2O_3$ [or] *and* $TiO_2$ starting materials in amounts suitable for yielding a compound within [the] formula $xNa_{0.5}Bi_{0.5}TiO_3\text{-}yK_{0.5}Bi_{0.5}TiO_3\text{-}zBaTiO_3$ where [(0<x≤1), (0<y≤1), (0<z≤1),] *(0<x<1), (0<y<1), 0<z<1),* (x+y+z=1), calcining the mixture at about 800° C. to about 950° C. for about 0.5 hrs to about 2 hrs to yield a calcined mixture, blending a *source of* dopant M *wherein the source is* selected from the group consisting of $Al_2O_3$, CoO, [$Co_2O_3$,] $Re_2O_3$ where Re is rare earth element, $NiCO_3$, $MnO_2$, $MnCO_3$, $Fe_2O_3$, and mixtures thereof with the calcined mixture to produce a doped mixture, milling the doped mixture to a particle size of about 0.5 microns to about 2 microns to produce a [calcined] *milled* mixture, compressing the [calcined] *milled* mixture at about 3000 PSI to about 10000 PSI to yield a preform, heating the preform to *a temperature of* about 500° C. to about 600° C. to yield a green preform, *and* sintering the green preform at about 1060° C. to about 1220° C. for about 0.5 hrs to about 2 hrs to yield a piezoelectric compound of [the] formula ($(xNa_{0.5}Bi_{0.5}TiO_3\text{-}yK_{0.5}Bi_{0.5}TiO_3\text{-}zBaTiO_3)\text{-}rM$ where [(0<x≤1), (0<y≤1), (0<z≤1),] *(0<x<1), (0<y<1), 0<z<1),* (x+y+z=1), (0<r≤5 wt %).

12. An ultrasonic transducer comprising the piezoelectric of claim 2.

13. The transducer of claim 12 wherein the transducer is a high intensity focused ultrasound (HIFU) transducer.

14. An ultrasonic motor comprising a piezoelectric compound of claim 2.

15. A piezoelectric transformer comprising a piezoelectric compound of claim 2.

*16. A piezoelectric compound according to claim 1 wherein (0<x≤0.85), (0<y<1), (0<z<0.2), (0<p<0.1), (x+y+z+p=1), (0.3≤m≤0.7), (0.3≤n≤0.7), and (0.9≤m/n≤1.1).*

*17. A Co-doped* $xNa_mBi_nTiO_3\text{-}yK_mBi_nTiO_3\text{-}zLi_mBi_nTiO_3\text{-}pBaTiO_3$ *piezoelectric compound where (0<x<1), (0<y<1), (0<z<1), (0<p<1), (x+y+z+p=1), (0.3≤m≤0.7), (0.3≤n≤0.7), (0.9≤m/n≤1.1), wherein* $Co_2O_3$ *is a source of Co dopant.*

*18. A Co-doped piezoelectric compound according to claim 17 where the Co dopant is present in an amount of 1.5 wt % based on the weight of* $xNa_mBi_nTiO_3\text{-}yK_mBi_nTiO_3\text{-}zLi_mBi_nTiO_3\text{-}pBaTiO_3$ *piezoelectric compound.*

*19. A Co-doped piezoelectric compound according to claim 18 where 0.80≤x≤0.85, 0.072≤y≤0.102, z=0.03, and 0.048≤p≤0.068.*

*20. The compound of claim 19 where x is 0.80, y is 0.102, z is 0.03, and p is 0.068.*

*21. Process for manufacture of Co doped* $xNa_{0.5}Bi_{0.5}TiO_3\text{-}yK_{0.5}Bi_{0.5}TiO_3\text{-}zLi_{0.5}Bi_{0.5}TiO_3\text{-}pBaTiO_3$ *piezoelectric compound where 0.80≤x≤0.85, 0.072≤y≤0.102, z=0.03, and 0.048≤p≤0.068 comprising,*

*forming a mixture of* $K_2CO_3$, $Na_2CO_3$, $Li_2CO_3$, $BaCO_3$, $TiO_2$ *and* $Bi_2O_3$, *calcining the mixture to form a calcined composition,*

*mixing the calcined composition with* $Co_2O_3$ *to form a doped composition, and sintering the doped composi-*

*tion to form Co doped* $xNa_{0.5}Bi_{0.5}TiO_3$-$yK_{0.5}Bi_{0.5}TiO_3$-$zLi_{0.5}Bi_{0.5}TiO_3$-$pBaTiO_3$ *where* $0.80 \leq x \leq 0.85$, $0.072 \leq y \leq 0.102$, *z is 0.03,* $0.048 \leq p \leq 0.068$ *and* $(x+y+z+p=1)$.

*22. The process of claim 21 wherein the mixture comprises 1.09 wt. %-1.54 wt. %* $K_2CO_3$, *9.32 wt. %-9.98 wt. %* $Na_2CO_3$, *0.243 wt. %-0.244 wt. %* $Li_2CO_3$, *4.17 wt. %-5.89 wt. %* $BaCO_3$, *35.22 wt. %-35.42 wt. %* $TiO_2$, *and 47.77-49.09 wt. %* $Bi_2O_3$, *where all amounts are based on total weight of the mixture, and wherein the calcining is performed at 880° C.*

*23. The process of claim 22 wherein the sintering is performed at 1100° C.*

*24. The process of claim 23 wherein the sintering is performed for 2 hrs.*

*25. The product of the process of claim 24.*

*26. The compound of claim 1 wherein* $(0.2 \leq y < 1)$.

*27. The compound of claim 4 wherein* $(0.2 \leq y < 1)$.

* * * * *